United States Patent
Ahn et al.

(10) Patent No.: US 7,501,298 B2
(45) Date of Patent: *Mar. 10, 2009

(54) LIQUID CRYSTAL DISPLAY PANEL AND FABRICATING METHOD THEREOF

(75) Inventors: Byung Chul Ahn, Ahnyang-si (KR);
 Soon Sung Yoo, Gunpo-si (KR); Oh Nam Kwon, Yongin-si (KR); Youn Gyoung Chang, Uiwang-si (KR);
 Heung Lyul Cho, Suwon-si (KR);
 Seung Hee Nam, Suwon-si (KR); Jae Young Oh, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 11 days.

This patent is subject to a terminal disclaimer.

(21) Appl. No.: 11/643,653

(22) Filed: Dec. 22, 2006

(65) Prior Publication Data

US 2007/0218577 A1     Sep. 20, 2007

Related U.S. Application Data

(62) Division of application No. 10/963,925, filed on Oct. 14, 2004, now Pat. No. 7,166,864.

(30) Foreign Application Priority Data

Oct. 14, 2003     (KR) .................. 10-2003-0071360

(51) Int. Cl.
 *H01L 21/00* (2006.01)

(52) U.S. Cl. ................... 438/30; 257/E21.535

(58) Field of Classification Search ............ 438/30
 See application file for complete search history.

(56) References Cited

U.S. PATENT DOCUMENTS 6,818,923 B2     11/2004     Kim et al.

(Continued)

FOREIGN PATENT DOCUMENTS

JP     H08-254676     10/1996

(Continued)

OTHER PUBLICATIONS

Korean Office Action dated Aug. 19, 2005.

*Primary Examiner*—W. David Coleman
(74) *Attorney, Agent, or Firm*—McKenna Long & Aldridge LLP

(57) ABSTRACT

A liquid crystal display (LCD) panel is fabricated with a reduced number of mask processes and includes a thin film transistor (TFT) array substrate and a color filter array substrate. The TFT array substrate includes gate and data lines insulatively crossing each other to define a pixel area, a TFT provided at the crossing of the gate and data lines, a passivation film protecting the TFT, a pixel electrode partially overlapped by the TFT, a gate pad connected to the gate line, and a data pad connected to the data line. The gate line, the gate and data pads, and the pixel electrode include a transparent conductive material. A gate metal material is on the transparent conductive material where the TFT partially overlaps the pixel electrode. The passivation film over the gate and data pads is removed to expose the transparent conductive material included within the gate and data pads.

21 Claims, 48 Drawing Sheets

U.S. PATENT DOCUMENTS

| | | | |
|---|---|---|---|
| 7,022,557 B2 * | 4/2006 | Kim et al. | 438/149 |
| 7,064,347 B2 | 6/2006 | Chang et al. | |
| 7,306,979 B2 * | 12/2007 | Chang et al. | 438/149 |
| 2005/0078264 A1 * | 4/2005 | Yoo et al. | 349/152 |
| 2005/0186718 A1 * | 8/2005 | Yoo et al. | 438/151 |

FOREIGN PATENT DOCUMENTS

| | | |
|---|---|---|
| JP | H12-002886 | 1/2001 |
| JP | H13-154221 | 6/2001 |

* cited by examiner

PROGRESSING DIRECTION
OF PLASMA GENERATOR

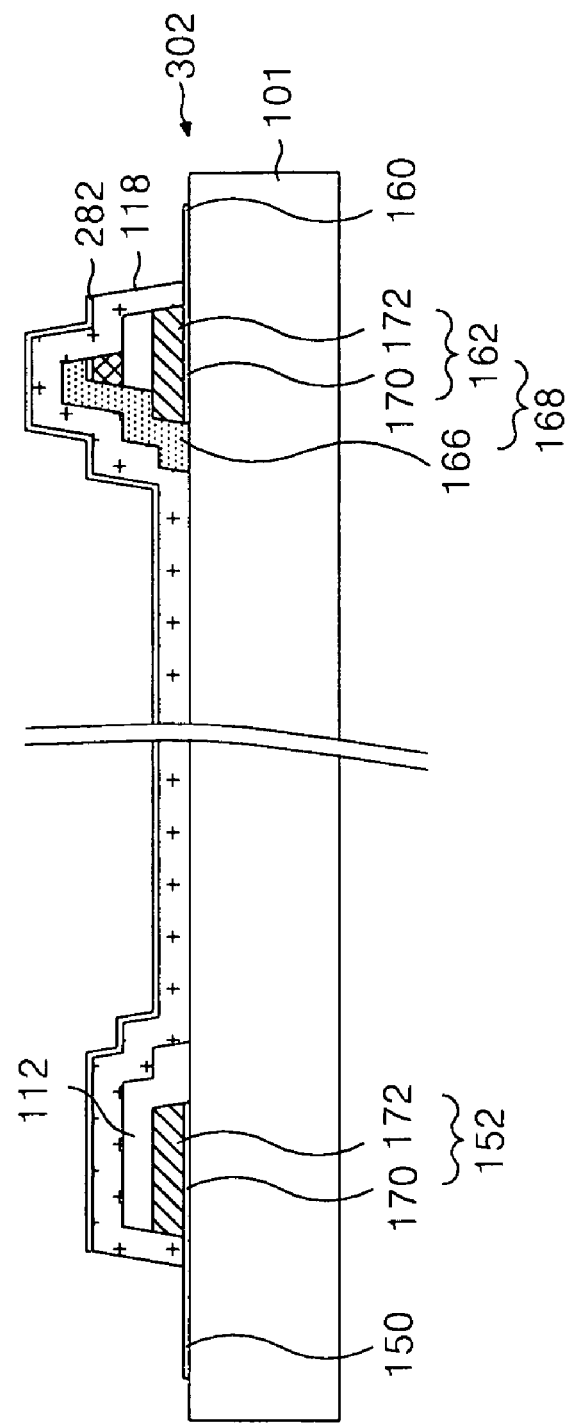

LIQUID CRYSTAL DISPLAY PANEL AND FABRICATING METHOD THEREOF

This application is a divisional application based on U.S. patent application Ser. No. 10/963,925, filed on Oct. 14, 2004 now U.S. Pat. No. 7,166,864, claims the benefit of Korean Patent Application No. P2003-71360, filed on Oct. 14, 2003, all of which are hereby incorporated by reference for all purposes as if fully set forth herein.

BACKGROUND OF THE INVENTION

1. Field of the Invention

The present invention relates to liquid crystal display (LCD) devices. More particularly, the present invention relates to a thin film transistor (TFT) array substrate for an LCD device and a simplified method of fabricating the same.

2. Discussion of the Related Art

Liquid crystal display (LCD) devices express pictures by selectively altering light transmittance characteristics of liquid crystal material within an LCD panel having a plurality of pixels arranged in a matrix. Light transmittance characteristics of the liquid crystal material can be selectively altered by generating an electric field through the liquid crystal material (i.e., driving the liquid crystal material) between a pixel electrode and a common electrode formed on opposing substrates.

Accordingly, a typical LCD panel includes a lower array substrate (i.e., a thin film transistor (TFT) array substrate) joined to, and spaced apart from, an upper array substrate (i.e., a color filter array substrate) to form a cell gap between the lower and upper substrates. Spacers are distributed within the cell gap to uniformly maintain the distance between the TFT array and color filter array substrates and liquid crystal material is arranged within the cell gap containing the spacers.

The TFT array substrate typically includes a plurality of signal wirings, a plurality of TFTs, and an alignment film coated thereon to impart an alignment to molecules of the liquid crystal material. The color filter array substrate includes a color filter for selectively transmitting light having predetermined ranges of wavelengths, a black matrix for preventing a light from being transmitted in regions outside the pixels, and an alignment film coated thereon to impart an alignment to molecules of the liquid crystal material.

The process used to fabricate the TFT array substrate described above is complicated and relatively expensive because it involves a number of semiconductor processing techniques that require a plurality of mask processes. It is generally known that a single mask process requires many sub-processes such as thin film deposition, cleaning, photolithography, etching, photo-resist stripping, inspection, etc. To reduce the complexity and cost associated with fabricating TFT array substrates, procedures have been developed to minimize the number masking process required. Accordingly, a four-mask process has been developed that removes the necessity of a mask process from a standard five-mask process.

FIG. 1 illustrates a plan view of a TFT array substrate of an LCD device, fabricated using a related art four-mask process. FIG. 2 illustrates a sectional view of the TFT array substrate taken along the II-II' line shown in FIG. 1.

Referring to FIGS. 1 and 2, the TFT array substrate includes gate lines 2 and data lines 4 formed so as to cross each other on a lower substrate 1 to define a plurality of pixel areas 5, a gate insulating film 12 between the gate and data lines 2 and 4, a TFT 30 provided each crossing of the gate and data lines 2 and 4, and a pixel electrode 22 provided at each pixel area. The TFT array substrate further includes a storage capacitor 40 provided at a region where a storage electrode 28 and the gate line 2 overlap, a gate pad 50 connected to each gate line 2, and a data pad 60 connected to each data line 4.

Each gate line 2 applies a gate signal to a gate electrode 6 of a corresponding TFT 30. Each data line 4 applies a pixel signal to a corresponding pixel electrode 22 via a drain electrode 10 of a corresponding TFT 30.

In response to a gate signal applied from a gate line 2, a TFT 30 charges and maintains a pixel signal, applied to a corresponding data line 4, in the pixel electrode 22. Accordingly, each TFT 30 includes a gate electrode 6 connected to a corresponding gate line 2, a source electrode 8 connected to a corresponding data line 4, and a drain electrode 10 connected to a corresponding pixel electrode 22.

Further, each TFT 30 includes an active layer 14 overlapping the gate electrode 6 and insulated therefrom by a gate insulating pattern 12. Accordingly, a channel is formed in a portion of the active layer 14 between the source and drain electrodes 8 and 10. An ohmic contact layer 16 is formed on the active layer 14 and ohmically contacts the data line 4, the source electrode 8, and the drain electrode 10 in addition to an overlaying lower data pad electrode 62 and storage electrode 28.

During operation, an electric field may be generated between the pixel electrode 22 and a common electrode supported by a color filter substrate (not shown). The liquid crystal material has a particular dielectric anisotropy. Therefore, in the presence of the electric field, molecules within the liquid crystal material rotate to align themselves vertically between the TFT and color filter array substrates. The magnitude of the applied electric field determines the extent of rotation of the liquid crystal molecules. Accordingly, various gray scale levels of light emitted by a light source (not shown) may be transmitted by a pixel area by varying the magnitude of the applied electric field.

Each storage capacitor 40 consists of the gate line 2 and the storage electrode 28 overlapping the gate line 2, wherein the two conductors are separated by the gate insulating film 12, the active layer 14, and the ohmic contact layer 16. The pixel electrode 22 is connected to the storage electrode 28 via a second contact hole 42 formed through a protective film 18 and is connected to the drain electrode 10 via a first contact hole 20. Constructed as described above, the storage capacitor 40 allows pixel signals charged at the pixel electrode 22 to be uniformly maintained until a next pixel signal is charged at the pixel electrode 22.

Each gate line 2 is connected to a gate driver (not shown) via a corresponding gate pad 50. Accordingly, the gate pad 50 consists of a lower gate pad electrode 52 and an upper gate pad electrode 54. The lower gate pad electrode 52 is an extension of gate line 2 and is connected to the upper gate pad electrode 54 via a third contact hole 56 formed through the gate insulating film 12 and the protective film 18.

Each data line 4 is connected to a data driver (not shown) via a corresponding data pad 60. Accordingly, the data pad 60 consists of a lower data pad electrode 62 and an upper data pad electrode 64. The lower data pad electrode 62 is an extension of the data line 4 and is connected to the upper data pad electrode 64 via a fourth contact hole 66 formed through the protective film 18.

Having described the TFT array substrate above, a method of fabricating the TFT array substrate according to the related art four-mask process will now be described in greater detail with reference to FIGS. 3A to 3D.

Referring to FIG. 3A, a gate metal pattern, including the gate line 2, the gate electrode 6, the lower gate pad electrode 52, is formed on the lower substrate 1 in a first mask process.

Specifically, a gate metal layer is formed over the entire surface of the lower substrate 1 in a deposition technique such as sputtering. The gate metal layer consists of a an aluminum group metal, etc. The gate metal layer is then patterned using photolithography and etching techniques in conjunction with an overlaying first mask pattern to provide the aforementioned gate metal pattern.

Referring next to FIG. 3B, a gate insulating film 12 is coated over the entire surface of the lower substrate 1 and on the gate metal pattern. In a second mask process, a semiconductor pattern and a data metal pattern are provided on the gate insulating film 12. The semiconductor pattern consists of the active layer 14 and the ohmic contact layer 16. The data metal pattern consists of the data line 4, the source electrode 8, the drain electrode 10, the lower data pad electrode 62, and the storage electrode 28.

Specifically, the gate insulating film 12, a first and a second semiconductor layer, and a data metal layer are sequentially formed over the surface of the lower substrate 1 and on the gate metal pattern by deposition techniques such as plasma enhanced chemical vapor deposition (PECVD) and sputtering. The gate insulating film 12 typically includes an inorganic insulating material such as silicon nitride (SiNx) or silicon oxide (SiOx). The active layer 14 is formed from the first semiconductor layer and typically includes undoped amorphous silicon. The ohmic contact layer 16 is formed from the second semiconductor layer and typically includes an $n^+$ amorphous silicon layer. The data metal layer typically includes molybdenum (Mo), titanium (Ti), tantalum (Ta).

A photo-resist film is then formed over the data metal layer and is photolithographically patterned using a second mask pattern. Specifically, the second mask pattern is provided as a diffractive exposure mask having a diffractive exposure region corresponding to a channel region of a subsequently formed TFT. Upon exposure through the second mask pattern and development, a photo-resist pattern is created wherein a portion of the photo-resist film remaining in a region corresponding to the channel region has a lower height relative to portions of the photo-resist film remaining in regions outside the channel region.

Subsequently, the photo-resist pattern is used as a mask to pattern the data metal layer in a wet etching process and to form the aforementioned data metal pattern (i.e., the data line 4, the source electrode 8, the drain electrode 10, and the storage electrode 28), wherein the source and drain electrodes 8 and 10 are connected to each other in a region corresponding to the channel region. Next, the photo-resist pattern is used as a mask to sequentially pattern the first and second semiconductor layers in a dry etching process and form the active layer 14 and the ohmic contact layer 16.

After the active and ohmic contact layers 14 and 16 are formed, the portion of the photo-resist having the relatively lower height is removed from the region corresponding to the channel region in an ashing process. Upon performing the ashing process, the relatively thicker portions of the photo-resist in regions outside the channel region are thinned but, nevertheless, remain. Using the photo-resist pattern as a mask, the portion of the data metal layer and the ohmic contact layer 16 arranged in the channel region are then etched in a dry etching process. As a result, the active layer 14 within the channel region is exposed, the source electrode 10 is disconnected from the drain electrode 12, and the remaining photo-resist pattern is removed in a stripping process.

Referring next to FIG. 3C, the protective film 18 is coated over the entire surface of the lower substrate 1, on the gate insulting film 12, on the data metal pattern, and on the active layer 14. In a third mask process, the first to fourth contact holes 20, 42, 56, and 66, respectively, are formed through the protective film 18 and gate insulting film 12.

Specifically, the protective film 18 is formed over the surface of the lower substrate 1, and on the gate insulting film 12, the data metal pattern, and the active layer 14 by a deposition technique such as plasma enhanced chemical vapor deposition (PECVD). The protective film 18 typically includes an inorganic insulating material such as silicon nitride (SiNx) or silicon oxide (SiOx), or an organic material having a small dielectric constant such as an acrylic organic compound, BCB (benzocyclobutene) or PFCB (perfluorocyclobutane). The protective film 18 is then patterned via an overlaying third mask pattern using photolithography and etching processes to thereby define the first to fourth contact holes 20, 42, 56 and 66.

The first contact hole 20 is formed through the protective film 18 to expose the drain electrode 10, the second contact hole 24 is formed through the protective film 18 to expose the storage electrode 28, the third contact hole 56 is formed through the protective film 18 and the gate insulating film 12 to expose the lower gate pad electrode 52, and the fourth contact hole 66 is formed through the protective film 18 to expose the lower data pad electrode 62.

Referring next to FIG. 3D, a transparent conductive pattern including the pixel electrode 22, the upper gate pad electrode 54, and the upper data pad electrode 64 are formed on the protective film 18 in a fourth mask process.

Specifically, a transparent conductive material is coated over the entire surface of the protective film 18 and in the first to fourth contact holes 20, 42, 56, and 66 by a deposition technique such as sputtering. The transparent conductive material typically includes indium-tin-oxide (ITO), tin-oxide (TO), or indium-zinc-oxide (IZO). In a fourth mask process, the transparent conductive material is patterned using photolithographic and etching techniques to thereby form the aforementioned transparent conductive pattern (i.e., the pixel electrode 22, the upper gate pad electrode 54, and the upper data pad electrode 64).

Accordingly, the pixel electrode 22 is electrically connected to the drain electrode 10 via the first contact hole 20 while also being electrically connected to the storage electrode 28, via the second contact hole 42. The upper gate pad electrode 54 is electrically connected to the lower gate pad electrode 52 via the third contact hole 56 and the upper data pad electrode 64 is electrically connected to the lower data pad electrode 62 via the fourth contact hole 66.

While the TFT array substrate described above may be formed using a four-mask process that is advantageous over previously known five-mask processes, the four-mask process can still be undesirably complicated and, therefore, costly. Accordingly, it would be beneficial to fabricate a TFT array substrate according to a less complex, and therefore less costly, process.

SUMMARY OF THE INVENTION

Accordingly, the present invention is directed to a liquid crystal display panel and a method of fabricating the same that substantially obviates one or more of the problems due to limitations and disadvantages of the related art.

An advantage of the present invention provides a TFT array substrate for a display device and a method of fabricating the same in a reduced number of mask processes.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, liquid crystal display panel according to one aspect of the present invention may, for example, include a thin film transistor (TFT) array substrate and a color filter array substrate joined to the TFT array substrate. The TFT array substrate may, for example, include a gate line provided on a substrate, a data line on the substrate crossing the gate line and defining a pixel area; a gate insulating pattern between the gate and data lines; a TFT at the crossing of the gate and data lines; a passivation film protecting the TFT; a pixel electrode within the pixel area, wherein a portion of the pixel electrode is overlapped by a portion of the TFT; a gate pad connected to the gate line; and a data pad connected to the data line. The gate line, the gate pad, the data pad, and the pixel electrode may, for example, include a transparent conductive material. Moreover, the pixel electrode may, for example, include a gate metal material between the transparent conductive material and the overlapping portion of the TFT. When joined to the color filter array substrate, a first portion of the TFT array substrate may be overlapped by the color filter array substrate and a second portion of the TFT array substrate may not be overlapped by the color filter array substrate. Portions of the transparent conductive material within the gate and data pads, arranged within the second portion, may be exposed by the passivation film.

In one aspect of the present invention, the liquid crystal display panel may further include a data link extending from the data line and connected to the data pad; and a gate link extending from the gate line and connected to the gate pad.

In still another aspect of the present invention, the data link may, for example, include a lower data link electrode including the transparent conductive material; and an upper data link electrode connected to the lower data link electrode and the data line.

In yet another aspect of the present invention, the liquid crystal display panel may further include a storage capacitor including the gate line and a storage electrode overlapping the gate line, wherein the storage electrode is insulated from the gate line and wherein the storage electrode is connected to a gate metal material of the pixel electrode.

In a further aspect of the present invention, the liquid crystal display panel may further include a redundancy line contacting a lower surface of the data line, wherein a width of the redundancy line is less than a width of the data line.

In still a further aspect of the present invention, the TFT may include a gate electrode, the gate link may include the transparent conductive material, and the transparent conductive material within the gate line, the gate electrode, the gate link, and the lower data link electrode may be overlapped by the gate metal material.

In yet a further aspect of the present invention, the TFT may, for example, include a gate electrode connected to the gate line; a source electrode connected to the data line; a drain electrode opposing the source electrode; a semiconductor layer on the gate insulating pattern and overlapping the gate electrode to define a channel between the source and drain electrodes.

In still a further aspect of the present invention, the liquid crystal display panel may further include a common electrode on the color filter array substrate for generating a vertically oriented electric field with respect to the pixel electrode.

In a further aspect of the present invention, the liquid crystal display panel may further include a common electrode on the substrate parallel to the pixel electrode for generating a horizontally oriented electric field with respect to the pixel electrode; a common line parallel to the gate line and connected to the common electrode; and a common pad connected to the common line for supplying a reference voltage to the common line.

In yet another aspect of the present invention, the semiconductor layer may be provided at an area where the gate line overlaps the data line.

In still another aspect of the present invention, the semiconductor layer may be formed along the data line.

According to principles of the present invention, a liquid crystal display panel may, for example, include a substrate; a gate line on the substrate; a data line on the substrate crossing the gate line defining a pixel area, wherein the data line is insulated from the gate line; a thin film transistor (TFT) at the crossing of the gate and data lines; a pixel electrode at the pixel area and connected to the TFT, wherein a portion of the pixel electrode is overlapped by a portion of the TFT; a gate pad connected to the gate line; a data pad connected to the data line; a passivation film over the substrate in a predetermined pattern not overlapping the gate and data pads; and an alignment film over the substrate, wherein the alignment film has the predetermined pattern, and wherein the gate line, the gate pad, the data pad, and the pixel electrode include a transparent conductive material and wherein the pixel electrode includes a gate metal material between the transparent conductive material and the overlapping portion of the TFT.

In one aspect of the present invention, the liquid crystal display panel may further include a data link extending from the data line and connected to the data pad; and a gate link extending from the gate line and connected to the gate pad.

In another aspect of the present invention, the data link may, for example, include a lower data link electrode including the transparent conductive material; and an upper data link electrode connected to the lower data link electrode and the data line.

In still another aspect of the present invention, the liquid crystal display panel may further include a storage capacitor including the gate line and a storage electrode overlapping the gate line, wherein the storage electrode is insulated from the gate line and wherein the storage electrode is connected to the gate metal material of the pixel electrode.

In yet another aspect of the present invention, the liquid crystal display panel may further include a redundancy line contacting a bottom surface of the data line, wherein a width of the redundancy line is less than a width of the data line.

In a further aspect of the present invention, the TFT may include a gate electrode, the gate link includes the transparent conductive material; and the transparent conductive material within the gate line, the gate electrode, the gate link, and the lower data link electrode is overlapped by the gate metal material.

In yet another aspect of the present invention, the thin film transistor may, for example, include a gate electrode connected to the gate line; a source electrode connected to the data line; a drain electrode opposing the source electrode; and a semiconductor layer on the gate insulating pattern and overlapping the gate electrode to define a channel between the source and drain electrodes.

In still another aspect of the present invention, the liquid crystal display panel may further include a common electrode on the substrate parallel to the pixel electrode for generating horizontally oriented electric field with respect to the pixel electrode; a common line parallel to the gate line and connected to the common electrode; and a common pad connected to the common line for supplying a reference voltage to the common line.

In another aspect of the present invention, the semiconductor layer may be provided at an area where the gate line overlaps the data line.

In one aspect of the present invention, the semiconductor layer may be formed along the data line.

According to principles of the present invention, a method of fabricating a liquid crystal display panel may, for example, include forming a gate pattern and a pixel electrode on a substrate, wherein the gate pattern includes a gate line, a gate electrode, a gate pad, and a data pad and wherein the gate pattern and pixel electrode include a transparent conductive material; forming a semiconductor pattern and a gate insulating pattern on the substrate, on the gate pattern, and on the pixel electrode; forming a data pattern on the substrate, the semiconductor pattern, and the gate insulating pattern, wherein the data pattern includes a data line, a source electrode, and a drain electrode overlapping the pixel electrode; exposing portions of the transparent conductive material within the data pad, the gate pad, and the pixel electrode within the data pattern; forming a passivation film over an entirety of the surface of the substrate; forming an alignment film on the passivation film in a predetermined pattern not overlapping the gate and data pads; and removing portions of the passivation film overlapping the gate and data pads using the alignment film as a mask, thereby exposing the portions of the transparent conductive material included within said gate and data pads, wherein the pixel electrode includes a gate metal material between the transparent conductive material formed and the overlapping drain electrode.

In one aspect of the present invention, portions of the passivation film may be removed by selectively etching the passivation film with respect to the alignment film.

In another aspect of the present invention, the passivation film may be etched with a gas including at least one of $Cl_2$, $CF_4$, $SF_6$, $CHF_3$, $NF_3$, $O_2$, and HF.

In yet another aspect of the present invention, the semiconductor and gate insulating patterns may be formed along the gate pattern, wherein a width of the semiconductor and gate insulating patterns is larger than a width of the gate pattern.

In a further aspect of the present invention, the semiconductor and gate insulating patterns may be formed to expose the gate pad, the data pad, and the pixel electrode.

In yet another aspect of the present invention, the method may further include forming a redundancy line contacting a lower surface of the data line to compensate for a resistance of the data line, wherein a width of the redundancy line is less than a width of the data line.

In still another aspect of the present invention, the method may further include forming a common electrode parallel to the pixel electrode for generating a horizontally oriented electric field with respect to the pixel electrode; forming a common line parallel to the gate line and connected to the common electrode; and forming a common pad connected to the common line for supplying a reference voltage to the common line.

In another aspect of the present invention, the method may further include forming a storage capacitor, wherein the storage capacitor includes a storage electrode overlapping the gate line and wherein the storage electrode is insulated from the gate line and is connected to the pixel electrode.

According to principles of the present invention, a method of fabricating a liquid crystal display panel may, for example, include forming a thin film transistor (TFT) array substrate, forming a color filter array substrate, and joining the TFT and color filter array substrates to each other. The TFT array substrate may be formed by forming a plurality of gate lines provided on a substrate; forming a plurality of data lines crossing the gate lines to define a plurality of pixel areas; forming a gate insulating pattern between the gate and data lines; forming a TFT at each crossing of the gate and data lines; forming a passivation film over the TFTs; forming a pixel electrode within each pixel area, wherein a portion of each pixel electrode is overlapped by a portion of a TFT; forming a plurality of gate pads connected to the plurality of gate lines; and forming a plurality of data pads connected to the plurality of data lines, wherein the gate line, the gate pad, the data pad, and the pixel electrode include a transparent conductive material and wherein the pixel electrode includes a gate metal material between the transparent conductive material and the overlapping portion of the TFT. Upon joining the TFT and color filter array substrates, a first portion of the TFT array substrate may be overlapped by the joined color filter array substrate; a second portion of the TFT array substrate may not be overlapped by the joined color filter array substrate; and the gate and data pads may be within the second portion of the TFT array substrate. Further, portions of the transparent conductive material within the gate and data pads may be exposed using the color filter array substrate as a mask.

In one aspect of the present invention, the TFT array substrate by further forming a gate pattern on the substrate, wherein the gate pattern includes the gate lines, a plurality of gate electrodes, the gate pads, and the data pads; forming a semiconductor pattern and a gate insulating pattern on the substrate, the gate pattern, and on pixel electrodes; forming a data pattern on the substrate, on the gate pattern, the pixel electrodes, and the gate insulating and semiconductor patterns, wherein the data pattern includes the data lines, source electrodes, and drain electrodes; exposing portions of the transparent conductive material within data pads, the gate pads, and the pixel electrodes within the data pattern; and forming a passivation film over an entirety of the surface of the substrate and on the data pattern.

In another aspect of the present invention, the method may further include forming a common electrode parallel to the pixel electrode for generating a horizontally oriented electric field with respect to the pixel electrode; forming a common line parallel to the gate line and connected to the common electrode; and forming a common pad connected to the common line for supplying a reference voltage to the common line.

In still another aspect of the present invention, the color filter array substrate may be formed by forming a common electrode on an upper substrate for generating a vertically oriented electric field with respect to the pixel electrode.

In yet another aspect of the present invention, the semiconductor and gate insulating patterns may be formed by forming the semiconductor and gate insulating patterns along the gate pattern, wherein a width of the semiconductor and gate insulating patterns is larger than a width of the gate pattern.

In a further aspect of the present invention, the semiconductor and gate insulating patterns may be formed to expose the gate pads, the data pads, and the pixel electrodes within the semiconductor and gate insulating patterns.

In yet another aspect of the present invention, portions of the transparent conductive material within the gate and data pads may be exposed by dry etching the passivation film in a plasma using the color filter array substrate as a mask.

In still another aspect of the present invention, the exposing may, for example, include in a first exposure, exposing portions of the transparent conductive material within one of the gate and data pads; and, in a second exposure, exposing portions of the transparent conductive material within the other of the gate and data pads.

In another aspect of the present invention, the exposing may, for example, include sequentially exposing portions of the transparent conductive material within individual ones of the plurality of gate pads and sequentially exposing portions of the transparent conductive material within individual ones of the plurality of data pads.

In one aspect of the present invention, the exposing may, for example, include providing a plurality of liquid crystal display panels within a chamber; injecting gas into the chamber; generating a plasma from the injected gas; and etching the passivation film of each liquid crystal display panel by using the generated plasma.

In another aspect of the present invention, portions of the transparent conductive material within the gate and data pads may, for example, be exposed by arranging a plurality of liquid crystal display panels within a cassette; loading the cassette having the plurality of liquid crystal display panels arranged therein into a chamber having a plurality of plasma generators; generating plasma from the plurality of plasma generators; and etching the passivation film of each liquid crystal display panel using the generated plasma.

In still another aspect of the present invention, portions of the transparent conductive material within the gate and data pads may, for example, be exposed by dry etching portions of the passivation film overlapping the gate and data pads using an etchant gas.

In yet another aspect of the present invention, the etchant gas may, for example, include at least one of Cl2, CF4, SF6, CHF3, NF3, O2, and HF.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 27A to 27C illustrate sectional views describing a method of fabricating the LCD panel shown in FIG. 26.

DETAILED DESCRIPTION OF THE ILLUSTRATED EMBODIMENTS

Reference will now be made in detail to embodiments of the present invention, examples of which are illustrated in the accompanying drawings.

Figure 1:
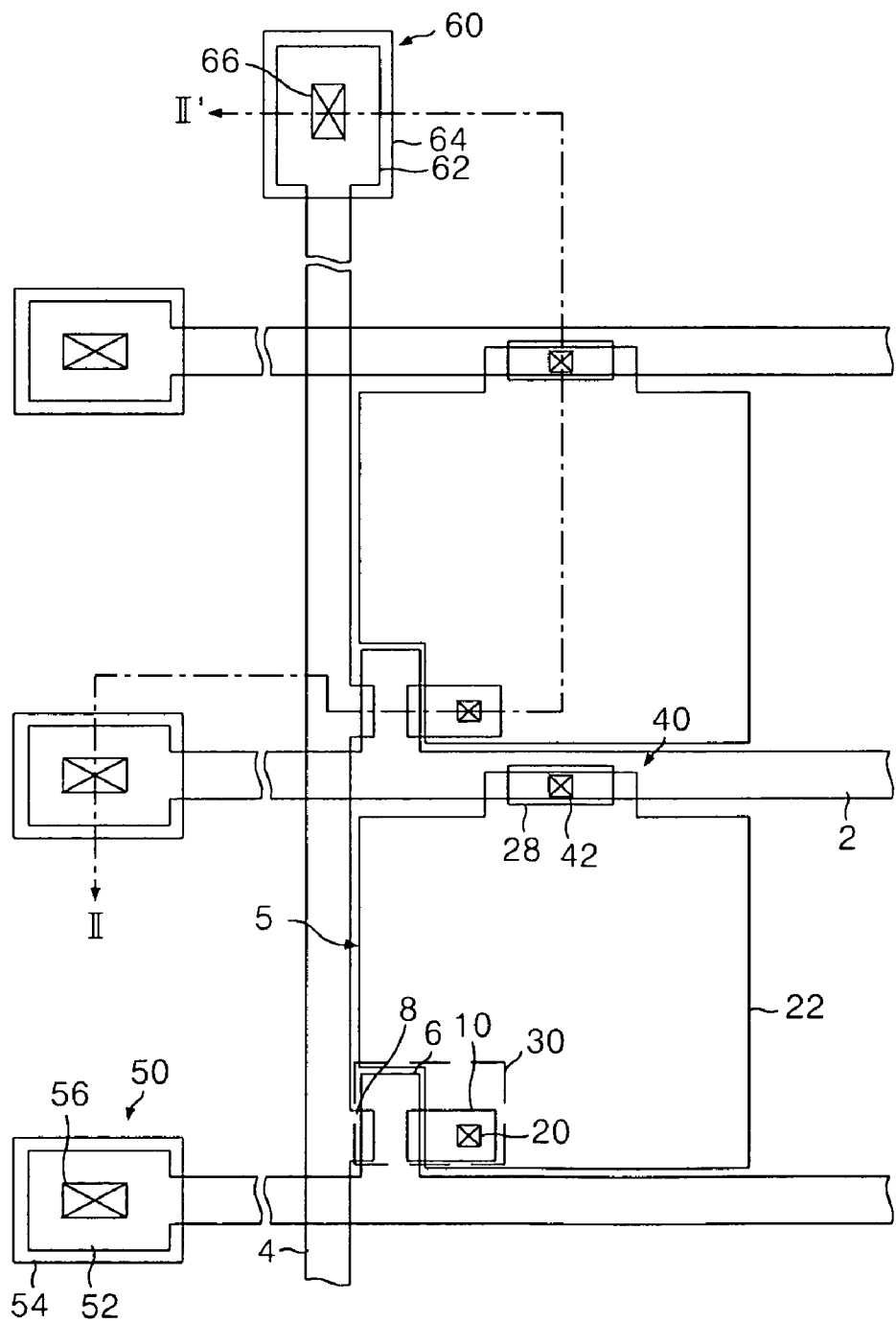
FIG. 1 illustrates a plan view of a thin film transistor (TFT) array substrate, fabricated using a related art four-mask process.
Figure 2:
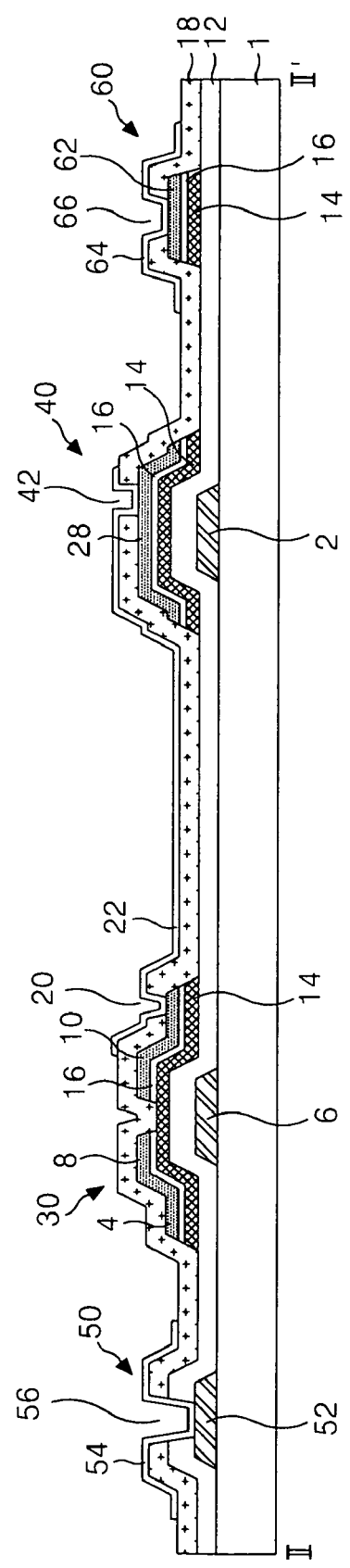
FIG. 2 illustrates a sectional view of the TFT array substrate taken along line II-II' shown in FIG. 1.
Figure 3A:
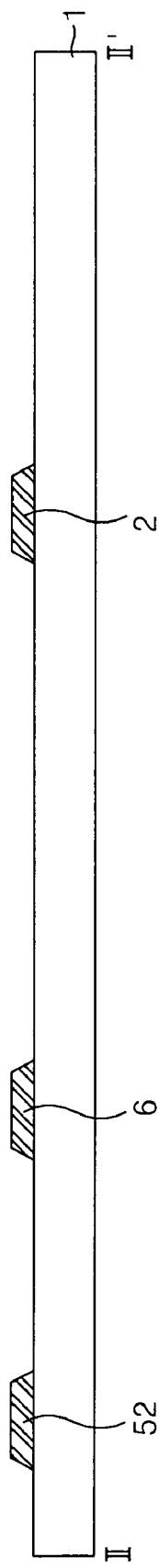
FIGS. 3A to 3D illustrate a method of fabricating the TFT array substrate shown in FIG. 2.
Figure 3B:
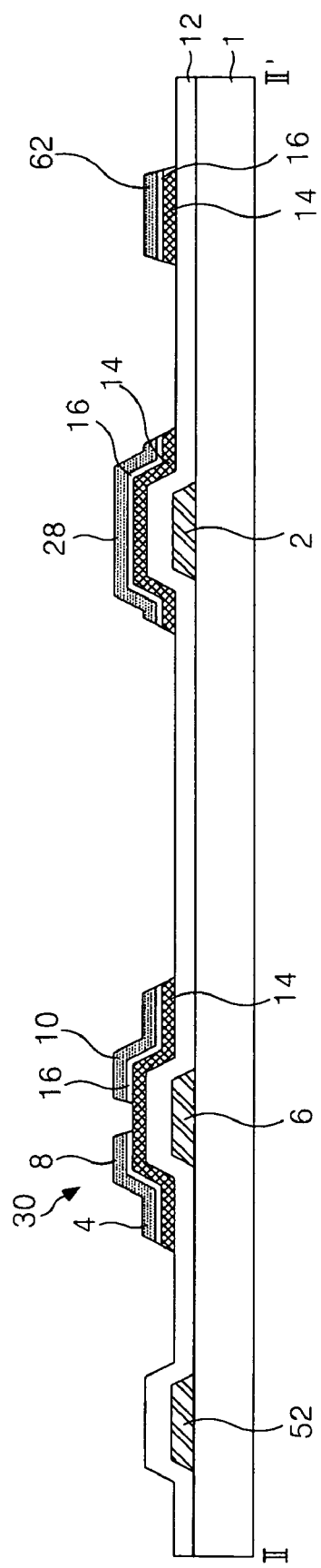
Figure 3C:
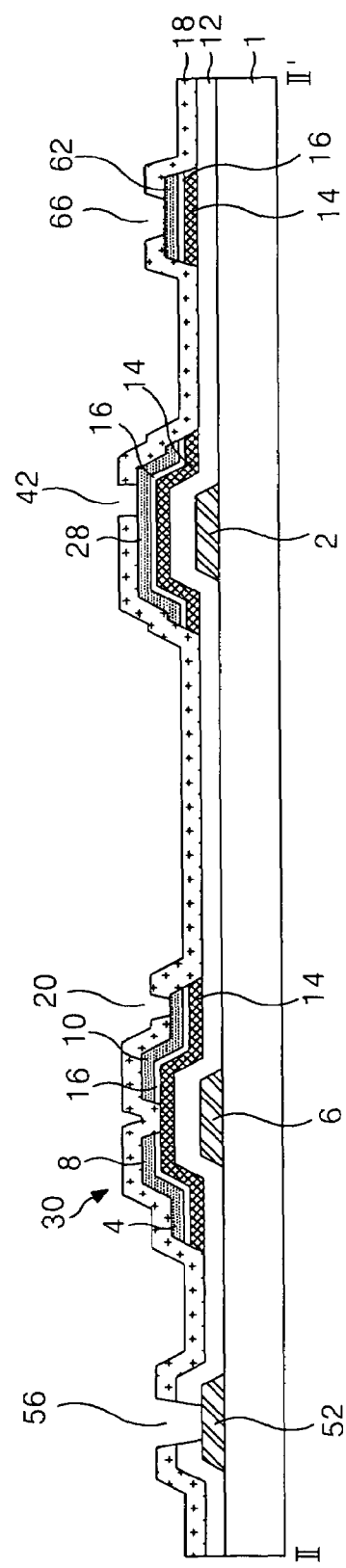
Figure 3D:
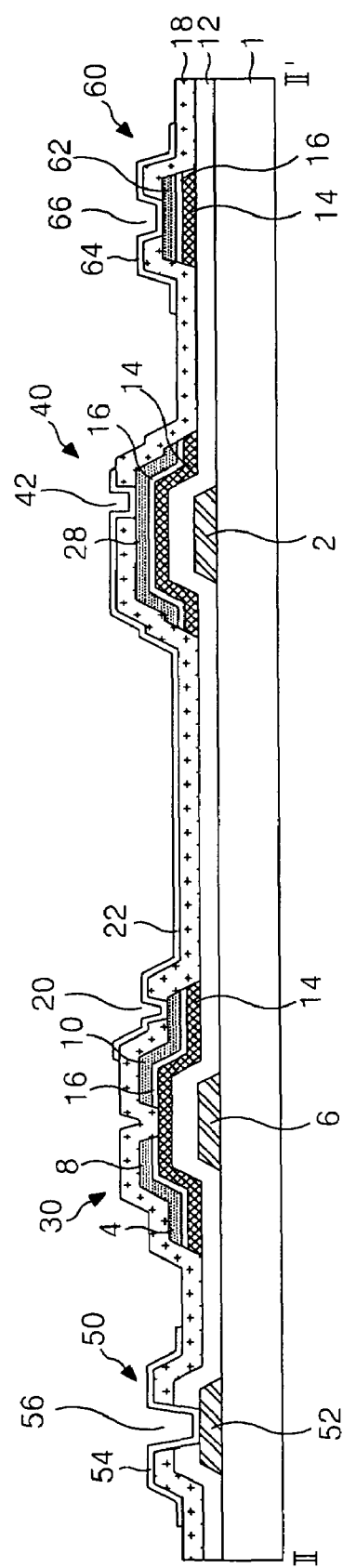
Figure 4:
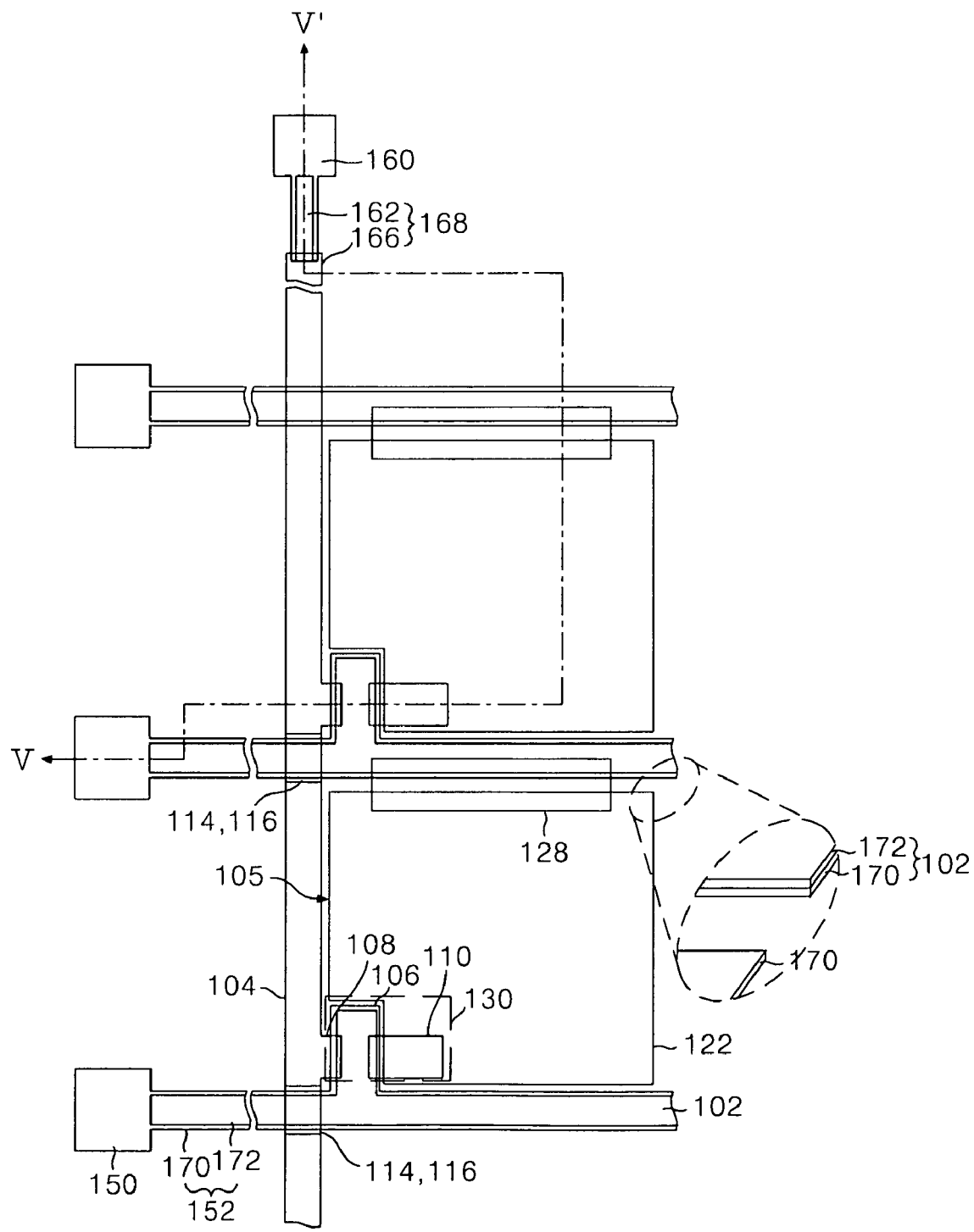
FIG. 4 illustrates a plan view of a portion of a TFT array substrate according to a first embodiment of the present invention.
Figure 5:
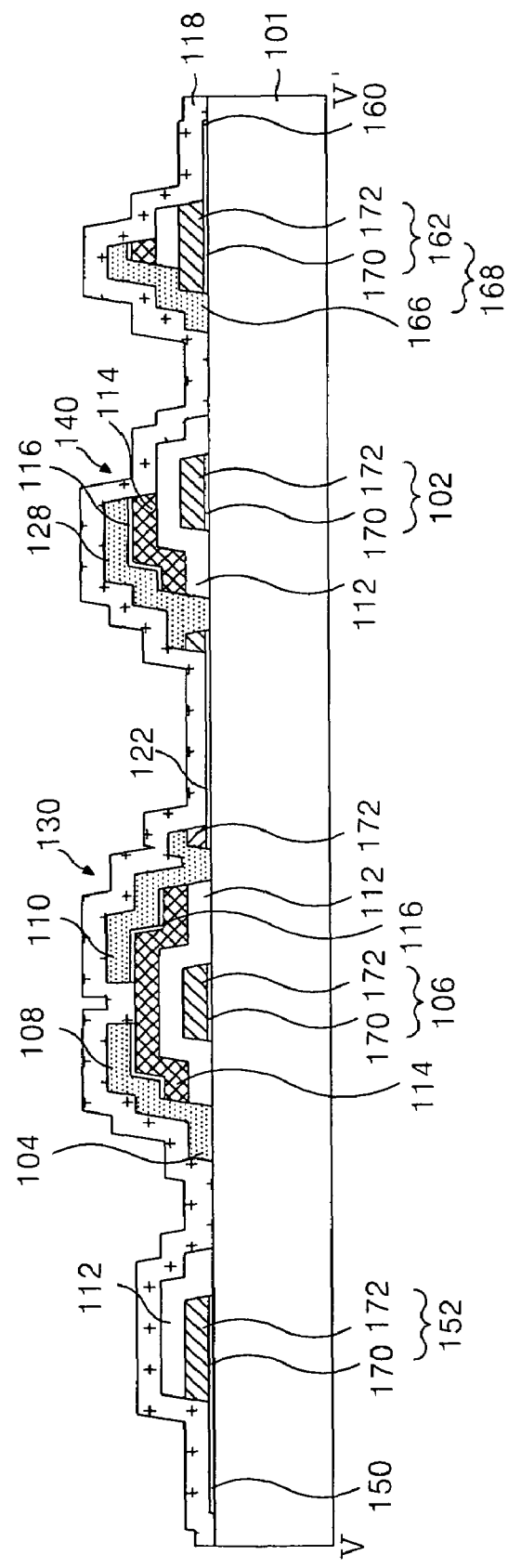
FIG. 5 illustrates a sectional view of the TFT array substrate taken along line V-V' shown in FIG. 4.

FIG. 4 illustrates a plan view of a portion of a TFT array substrate according to a first embodiment of the present invention. FIG. 5 illustrates a sectional view of the TFT array substrate taken along line V-V' shown in FIG. 4.

Referring to FIGS. 4 and 5, the TFT array substrate according to the principles of the present invention, may, for example, include gate lines 102 and data lines 104 formed so as to cross each other on a lower substrate 142 to define a plurality of pixel areas 105; a gate insulating pattern 114 formed between the gate and data lines 102 and 104; a thin film transistor 130 at each crossing of the gate and data lines 102 and 104; and a pixel electrode 122 arranged within each pixel area and directly contacting the drain electrode 110. The TFT array substrate may further include a storage capacitor 140 provided at a region where an upper storage electrode 128 and a gate line 102 overlap, a gate pad 150 connected to each gate line 102, and a data pad 160 connected to each data line 104. The upper storage electrode 128 may be connected to the pixel electrode 122.

In response to a gate signal applied from a gate line 102, a TFT 130 charges and maintains a pixel signal, applied to a corresponding data line 104, in the pixel electrode 122. Accordingly, an electric field may be generated between the pixel electrode 122 and a common electrode, to which a reference voltage is supplied, supported by a color filter substrate (not shown). The liquid crystal material has a particular dielectric anisotropy. Therefore, in the presence of the electric field, molecules within the liquid crystal material rotate to align themselves vertically between the TFT and color filter array substrates. The magnitude of the applied electric field determines the extent of rotation of the liquid crystal molecules. Accordingly, various gray scale levels of light emitted by a light source (not shown) may be transmitted by a pixel area by varying the magnitude of the applied electric field.

Accordingly, each TFT 130 may, for example, include a gate electrode 106 connected to a corresponding gate line 102, a source electrode 108 connected to a corresponding data line 104, and a drain electrode 110 connected to a corresponding pixel electrode 122. Further, each thin film transistor 130 may include an active layer 114 overlapping the gate electrode 106 and insulated therefrom by the gate insulating pattern 112. Accordingly, a channel may be formed in a portion of the active layer 114 between the source electrode 108 and the drain electrode 110. An ohmic contact layer 116 may be formed on the active layer 114 to ohmically contact the data line 104, the source electrode 108, the storage electrode 128, and the drain electrode 110. Further, the active and ohmic contact layers 114 and 116 are overlapped by the data line 104, a lower data pad electrode 136, and a first upper storage electrode 122. In one aspect of the present invention, portions of the active and ohmic contact layers 114 and 116 between cells may be removed to prevent signal interference therebetween.

The gate electrode 106 and the gate line 102 comprise a transparent conductive material 170 and a gate metal material 172 overlaying the transparent conductive material 172. Additionally, a portion of the pixel electrode 122 that is overlapped by the drain electrode 110 and the storage electrode 128 may comprise the transparent conductive material 170 and gate metal material 172 while the portion of the pixel electrode 122 within the pixel area 105 may comprise only the transparent conductive material 170.

The storage capacitor 140 comprises the upper storage electrode 128 overlapping a portion of a gate line 102 and is separated from the gate line 102 by a gate insulating film 112, the active layer 114, and the ohmic contact layer 116. The upper storage electrode 128 directly contacts the pixel electrode 122. Accordingly, the storage capacitor 140 allows pixel signals charged at the pixel electrode 122 to be uniformly maintained until a next pixel signal is charged at the pixel electrode 122.

Gate signals may be supplied to each gate line 102 via a corresponding gate pad 150. Accordingly, each gate pad 105 may be connected to a gate driver (not shown) via a gate link 152. In one aspect of the present invention, each gate pad 150 may comprise a transparent conductive material 170. In another aspect of the present invention, the gate link 152, the gate line 102, and the gate electrode 106 may comprise the transparent conductive material 170 and the overlaying gate metal material 172. In yet another aspect of the present invention, at least a portion of the transparent conductive material 170 of the gate pad 150 extending from the gate link 152 and connected to the gate line 102 may be exposed by the gate metal material 172.

Data signals may be supplied to each data line 104 via a corresponding data pad 160. Accordingly, each data pad 160 may be connected to a data driver (not shown) via a data link 168. In one aspect of the present invention, each data pad 160 may comprise a transparent conductive material 170. In another aspect of the present invention, at least a portion of the transparent conductive material 170 of the data pad 160 extending from the data link 168 and connected to the data line 104 may be exposed by the gate metal material 172. In still another aspect of the present invention, the data link 168 may, for example, include a lower data link electrode 162 and an upper data link electrode 166 connected to the lower data link electrode 162 and the data line 104. In yet another aspect of the present invention, the lower data link electrode 162 may, for example, include the transparent conductive material 170 and the overlaying gate metal material 172. The gate insulating pattern 112, the active layer 114 and the ohmic contact layer 116 may optionally be formed between the lower data link electrode 162 and the upper data link electrode 166.

Figure 6A:
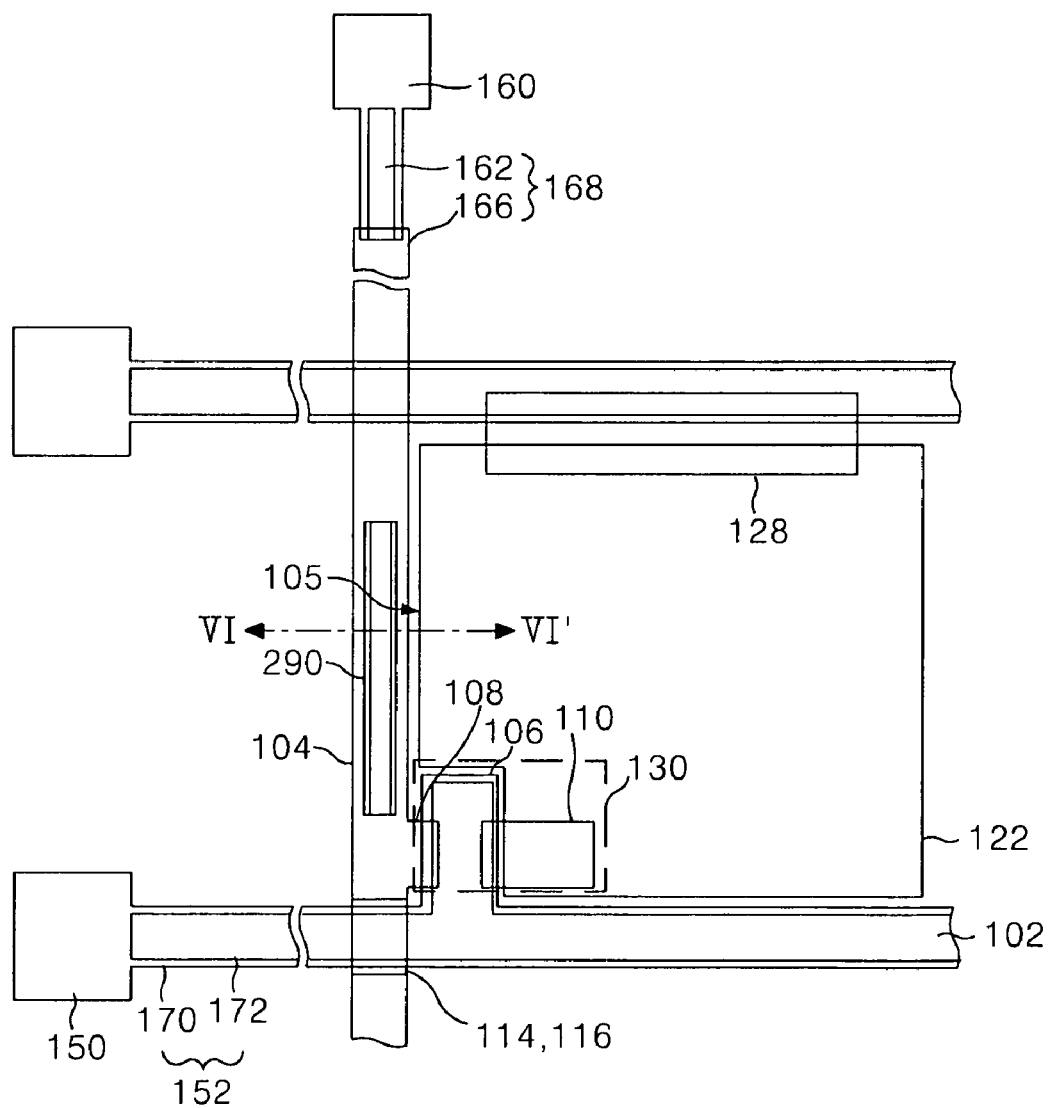
FIGS. 6A and 6B illustrate plan and sectional views, respectively, of a redundancy line at a lower portion of the data line shown in FIG. 4.
Figure 6B:
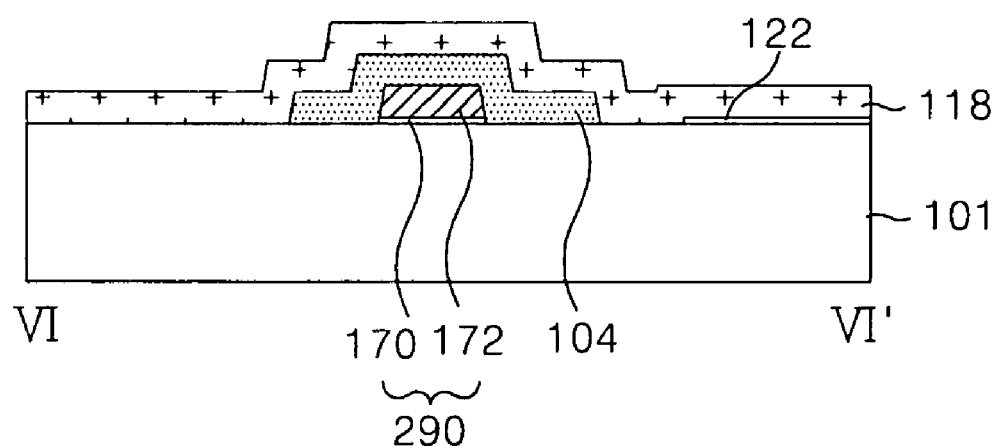

Referring to FIGS. 6A and 6B, a redundancy line 290 may be provided beneath the data line 104 and directly contact the data line 104. In one aspect of the present invention, a width of the redundancy line 290 may be less than a width of the data line 104 and may compensate for a resistance of the data line 104. In another aspect of the present invention, the redundancy line 290 may include the transparent conductive material 170 and the overlaying gate metal material 172.

Figure 7A:
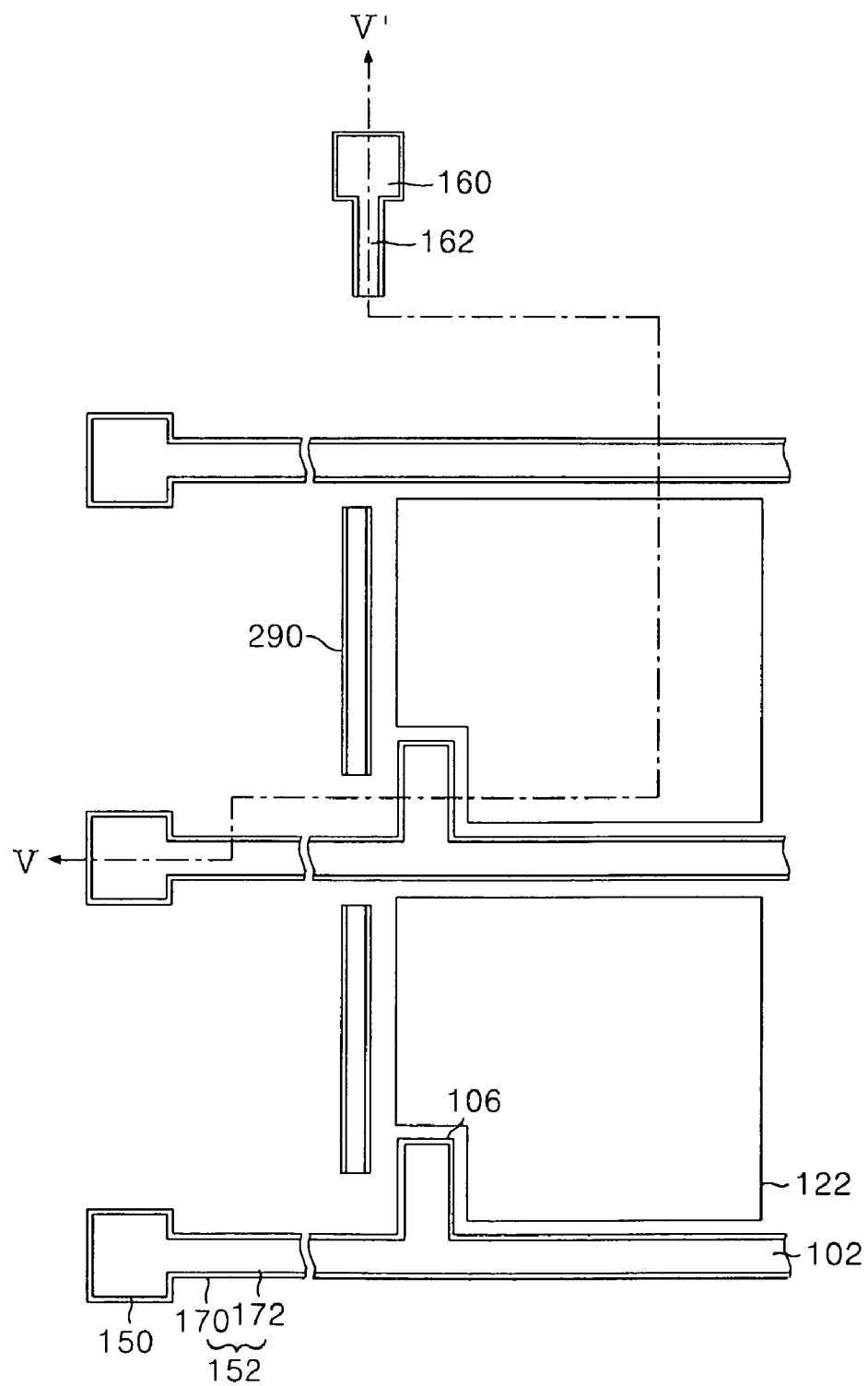
FIGS. 7A and 7B illustrate plan and sectional views, respectively, describing a first mask process in the method of fabricating the TFT array substrate according to the first embodiment of the present invention.
Figure 7B:
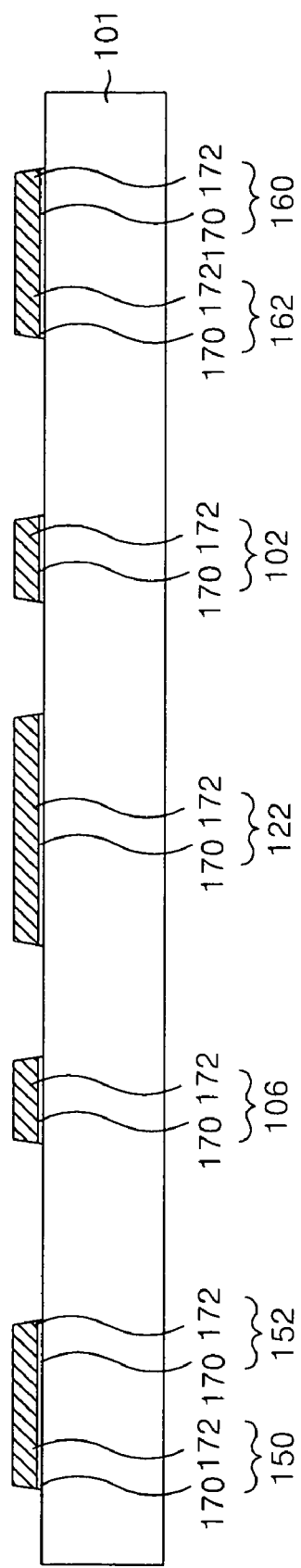

FIGS. 7A and 7B illustrate plan and sectional views, respectively, describing a first mask process in the method of fabricating the TFT array substrate according to the first embodiment of the present invention.

Referring to FIGS. 7A and 7B, the pixel electrode 122 and a gate pattern may be formed on the lower substrate 101 in a first mask process. In one aspect of the present invention, the gate pattern may, for example, include the gate line 102, the gate electrode 106, the gate link 152, the gate pad 150, the data pad 160, the lower data link electrode 162, and the redundancy line 290.

According to principles of the present invention, the gate pattern comprises a double-layer structure including the transparent conductive material 170 and the overlaying gate metal material 172. In one aspect of the present invention, the double-layer structure may be formed by sequentially depositing the transparent conductive material 170 and the gate metal material 172 on the lower substrate 101 by a technique such as sputtering, or the like. In another aspect of the present invention, the transparent conductive material 170 may include a material such as indium-tin-oxide (ITO), tin-oxide (TO), indium-zinc-oxide (IZO) or indium-tin-zinc-oxide (ITZO), or the like, or combinations thereof. In still another aspect of the present invention, the gate metal material 172 may include a material such as an aluminum group metal (e.g., aluminum/neodymium (AlNd), etc.) molybdenum (Mo), copper (Cu), chrome (Cr), tantalum (Ta), titanium (Ti), or the like, or combinations thereof. The transparent conductive material 170 and gate metal material 172 may be patterned using photolithographic and etching techniques using a first mask pattern to provide the aforementioned gate pattern and pixel electrode 122.

Figure 8A:
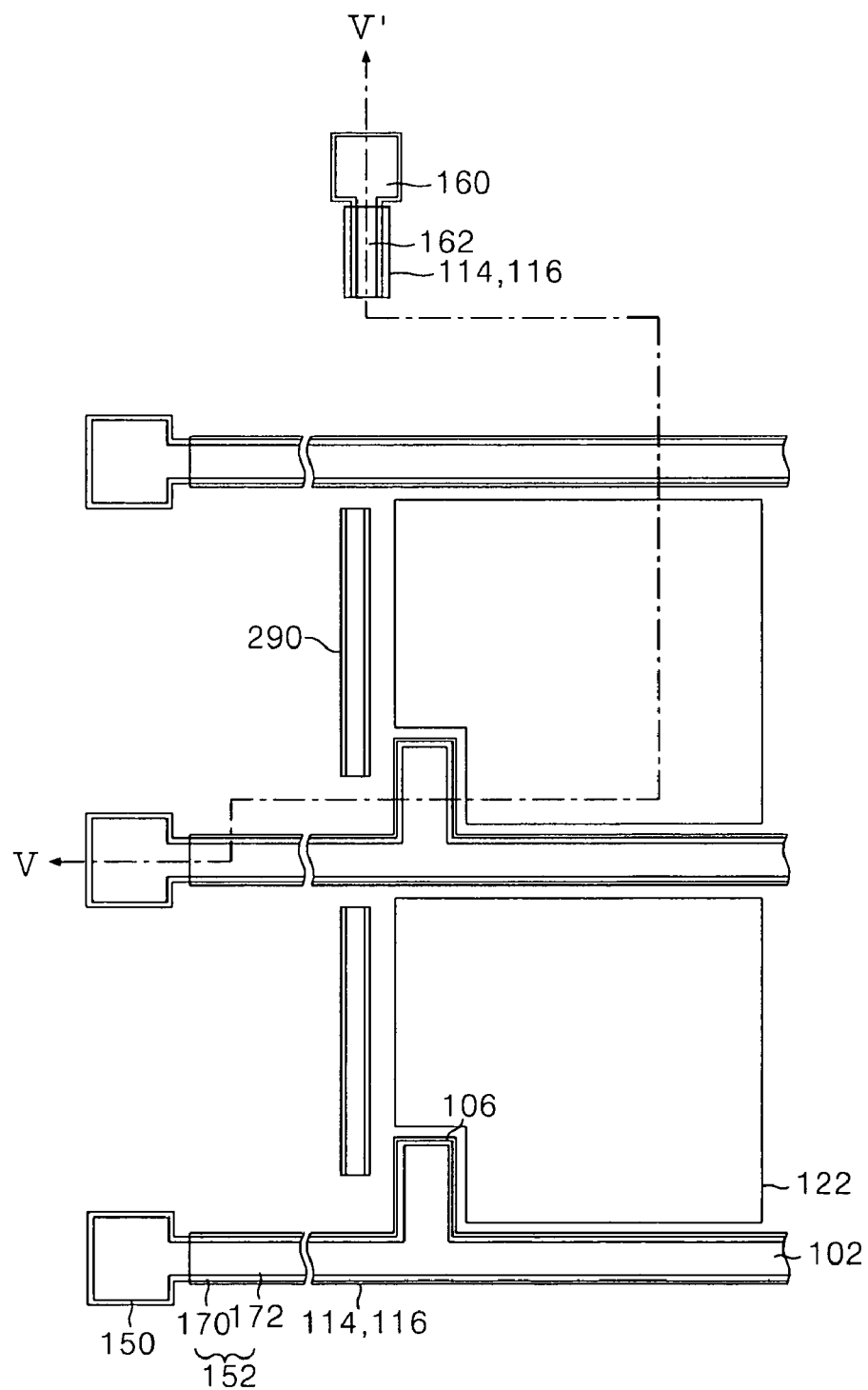
FIGS. 8A and 8B illustrate plan and sectional views, respectively, describing a second mask process in the method of fabricating the TFT array substrate according to the first embodiment of the present invention.
Figure 8B:
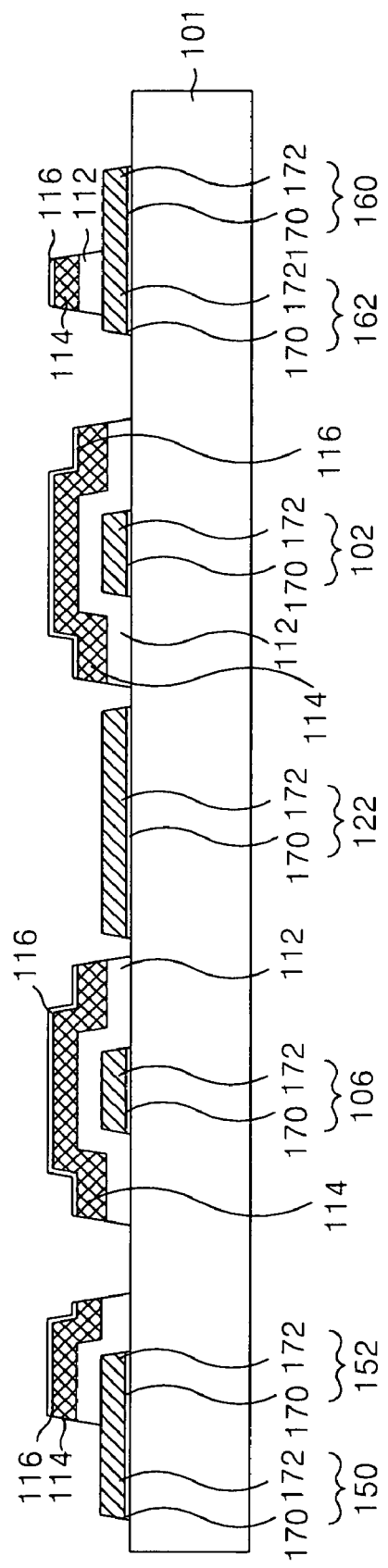

FIGS. 8A and 8B illustrate plan and sectional views, respectively, describing a second mask process in the method of fabricating the TFT array substrate according to the first embodiment of the present invention.

Referring to FIGS. 8A and 8B, the gate insulating pattern 112 and a semiconductor pattern including of the active layer 114 and the ohmic contact layer 116 may be formed on the lower substrate 101 in a second mask process. According to principles of the present invention, the gate insulating pattern 112 and the active and ohmic contact layers 114 and 116 are formed to expose the gate pad 150, the data pad 160, the lower data link electrode 162, and the pixel electrode 122.

For example, a gate insulating film, a first semiconductor layer, and a second semiconductor layer may be sequentially formed over the entire surface of the lower substrate 101. In one aspect of the present invention, the gate insulating film, and first and second semiconductor layers may be formed according to a deposition technique such as PEVCD, sputtering, or the like. In another aspect of the present invention, the gate insulating film may, for example, include an inorganic insulating material such as silicon nitride (SiNx) or silicon oxide (SiOx). In another aspect of the present invention, the first semiconductor layer may, for example, include undoped amorphous silicon. In still another aspect of the present invention, the second semiconductor layer may, for example, include N- or P-doped amorphous silicon.

The gate insulating film and the first and second semiconductor layers may then be patterned by aligning a second mask over the lower substrate 101 and applying photolithography and etching techniques to form a gate insulating pattern 112 and a semiconductor pattern overlaying the gate insulating pattern 112. In one aspect of the present invention, the gate insulating pattern 112 overlaps the gate line 102, the gate electrode 106, and the gate link 152, and the data link 162. In another aspect of the present invention, the semiconductor pattern may include the active layer 114 and the ohmic contact layer 116, wherein a width of the semiconductor pattern may be larger than a width of the gate pattern to prevent a deterioration of channel characteristics.

Figure 9A:
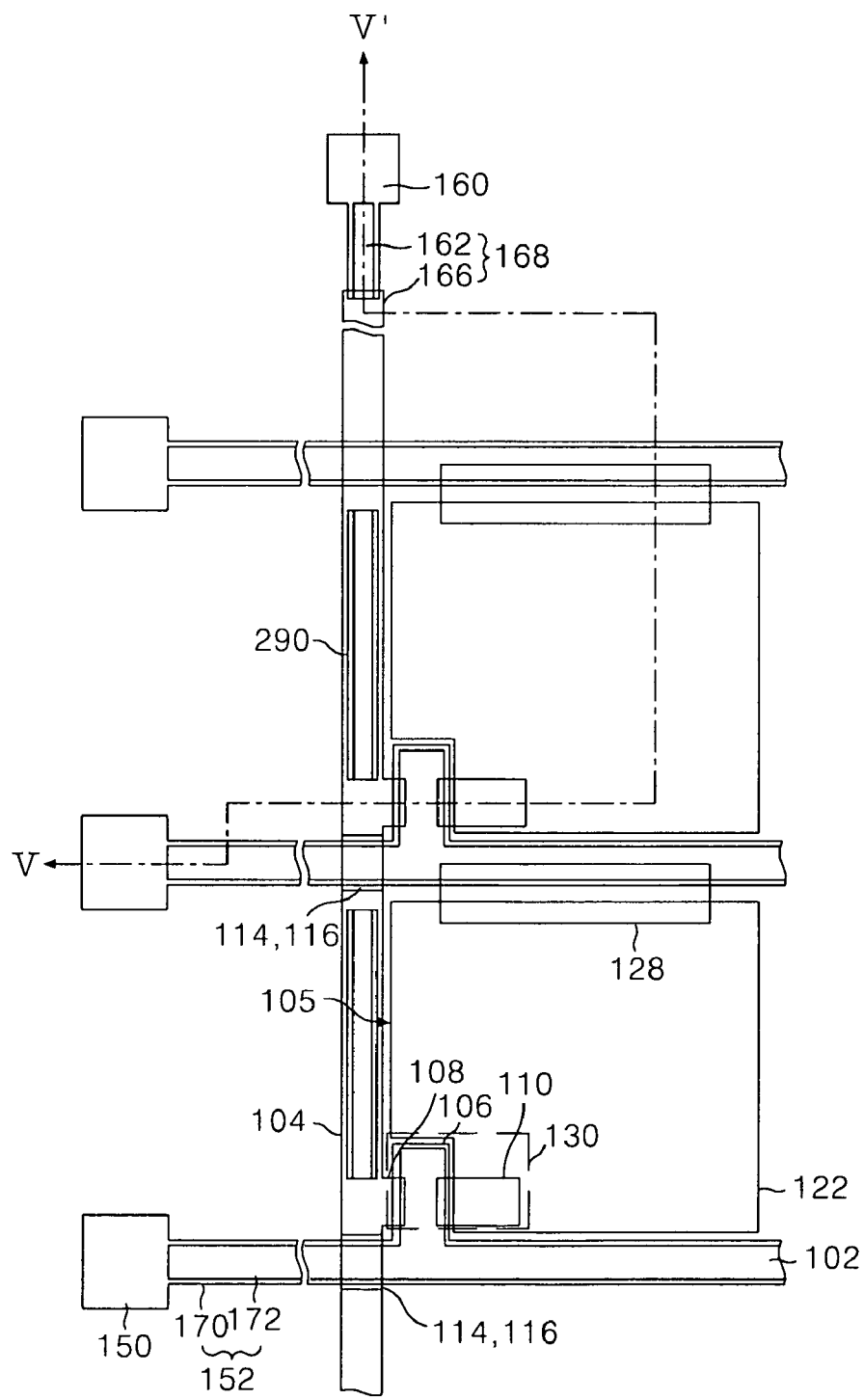
FIGS. 9A and 9B illustrate plan and sectional views, respectively, generally describing a third mask process in the method of fabricating the TFT array substrate according to the first embodiment of the present invention.
Figure 9B:
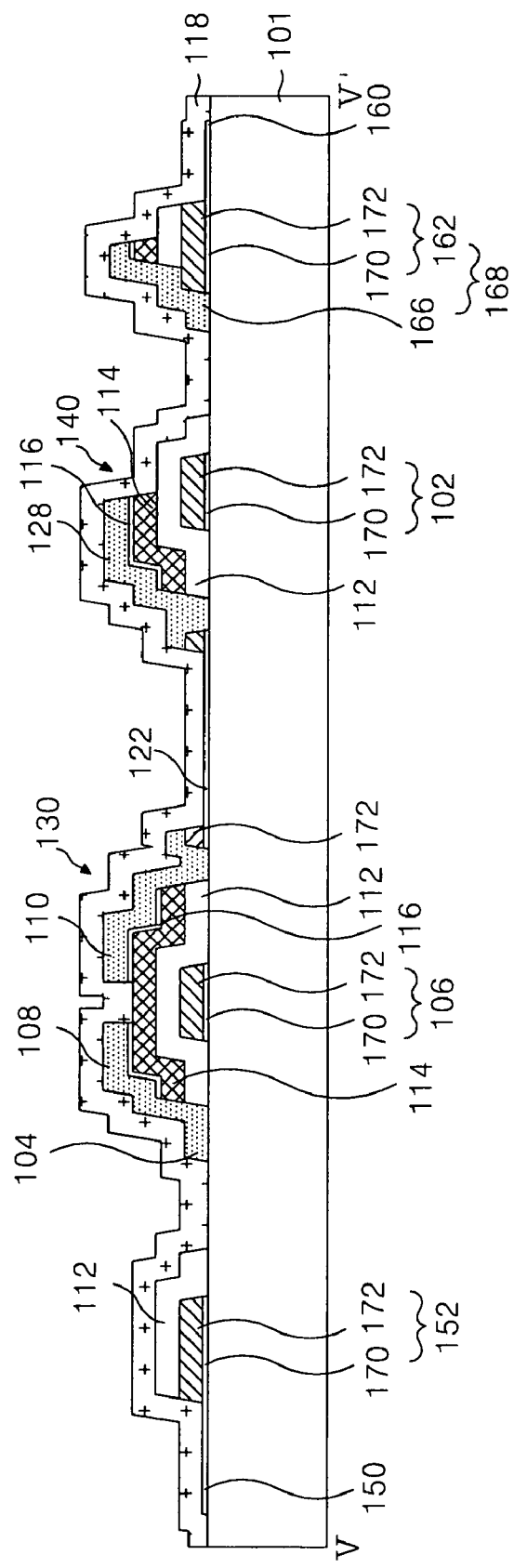

FIGS. 9A and 9B illustrate plan and sectional views, respectively, generally describing a third mask process in the method of fabricating the TFT array substrate according to the first embodiment of the present invention.

Referring to FIGS. 9A and 9B, a data pattern may be formed on the lower substrate 101, on the gate insulating pattern 112, and on the semiconductor pattern in a third mask process. In one aspect of the present invention, the data pattern may, for example, include the data line 104, the source electrode 108, the drain electrode 110, the storage electrode 128, and the upper data link electrode 166. In another aspect of the present invention, portions of the gate metal material 172 included within the data pad 160, the gate pad 150 and the pixel electrode 122 may, during the third mask process, be removed to expose the transparent conductive material 170 included therein.

The third mask process of the first embodiment described above with respect to FIGS. 9A and 9B will now be described in greater detail with reference to FIGS. 10A to 10E.

Figure 10A:
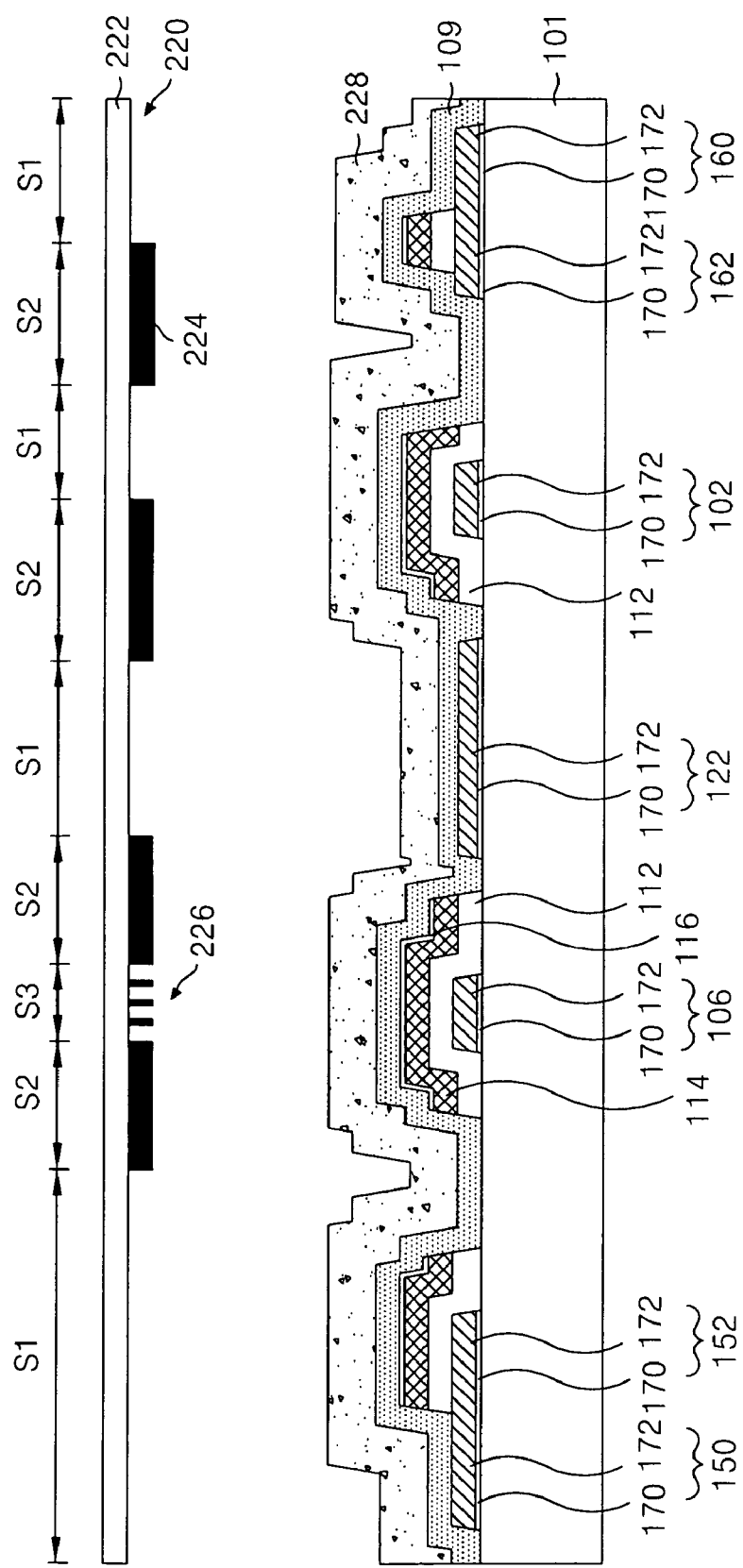
FIGS. 10A to 10E illustrate sectional views specifically describing the third mask process shown in FIGS. 9A and 9B.

Referring to FIG. 10A, a data metal layer 109 may be formed on the lower substrate 101, the gate insulating pattern 112, and on the active and ohmic contact layers 114 and 116. In one aspect of the present invention, the data metal layer 109 may be formed using a deposition technique such as sputtering, or the like. In another aspect of the present invention, the data metal layer 109 may, for example, include a metal such as molybdenum (Mo), copper (Cu), or the like, or combinations thereof.

Subsequently, a photo-resist film 228 is formed over the entire surface of the data metal layer 109 and is photolithographically patterned using a third mask pattern 220. According to principles of the present invention, the third mask pattern 220 is provided as a partial-exposure mask. For example, the third mask pattern 220 may include a mask substrate 222 formed of a suitably transparent material, a plurality of shielding parts 224 within shielding areas S2 on the mask substrate 222, and a partial-exposure part (e.g., a diffractive part or transflective part) 226 within a partial-exposure area S3 on the mask substrate 222. It should be noted that areas of the mask 222 that do not support a shielding or partial-exposure parts are referred to as exposure areas S1.

Figure 10B:
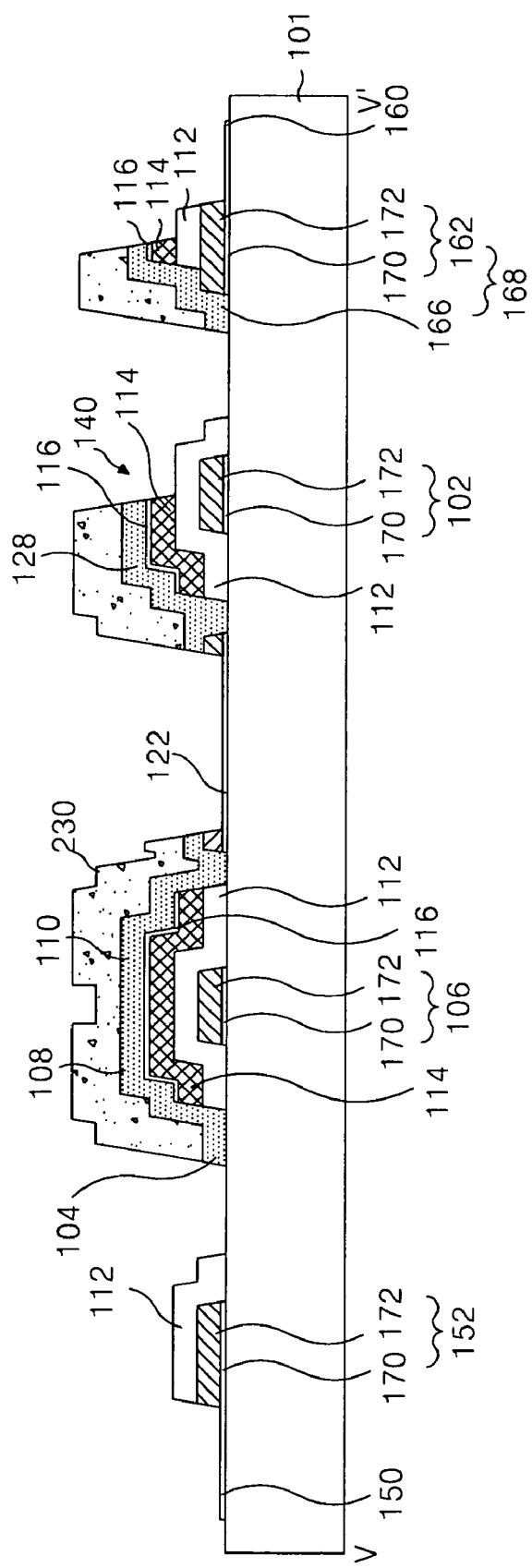

Referring to FIG. 10B, the photo-resist film 228 may, via the third mask pattern 220, be selectively exposed to light through the exposure areas S1 and be developed, thereby creating a photo-resist pattern 230 having a step difference between the shielding and partial-exposure areas S2 and S3. Accordingly, the height of the photo-resist pattern 230 within the partial-exposure area S3 may be lower than the height of the photo-resist pattern 230 within the shielding areas S2.

Subsequently, the photo-resist pattern 230 is used as a mask to pattern the data metal layer 109 in a wet etching technique and form the aforementioned data pattern (i.e., the storage electrode 128, the data line 104, the source electrode 108, the drain electrode 110, and the upper data link electrode 166) wherein the source and drain electrodes 108 and 110 are connected to each other in a region corresponding to partial-exposure area S3 (i.e., the channel region of a subsequently formed TFT 130), wherein the source electrode 108 is connected to one side of the data line 104, and wherein the upper data link electrode 166 is connected to another side of the data line 104.

Using the gate insulating pattern 112 as a mask, portions of the gate metal material 172 included within the data pad 160, the gate pad 150 may be removed. Additionally, portions of the gate metal material 172 in regions of the pixel electrode 122 that are exposed by the photo-resist pattern 230 may be removed. Accordingly, the gate metal material 172 may remain in areas where the pixel electrode 122 overlaps with the drain electrode 110 and the storage electrode 128.

Next, the photo-resist pattern 230 may be used as a mask to pattern the first and second semiconductor layers in a dry etching process, thereby forming the active and ohmic contact layers 114 and 116. In one aspect of the present invention, the patterning may, for example, include removing portions of the active and ohmic contact layers 114 and 116 that are not overlapped by the data pattern. In another aspect of the present invention, the patterning may, for example, include dry etching portions of the active and ohmic contact layers 114 and 116 between cells may be removed to prevent signal interference therebetween.

Figure 10C:
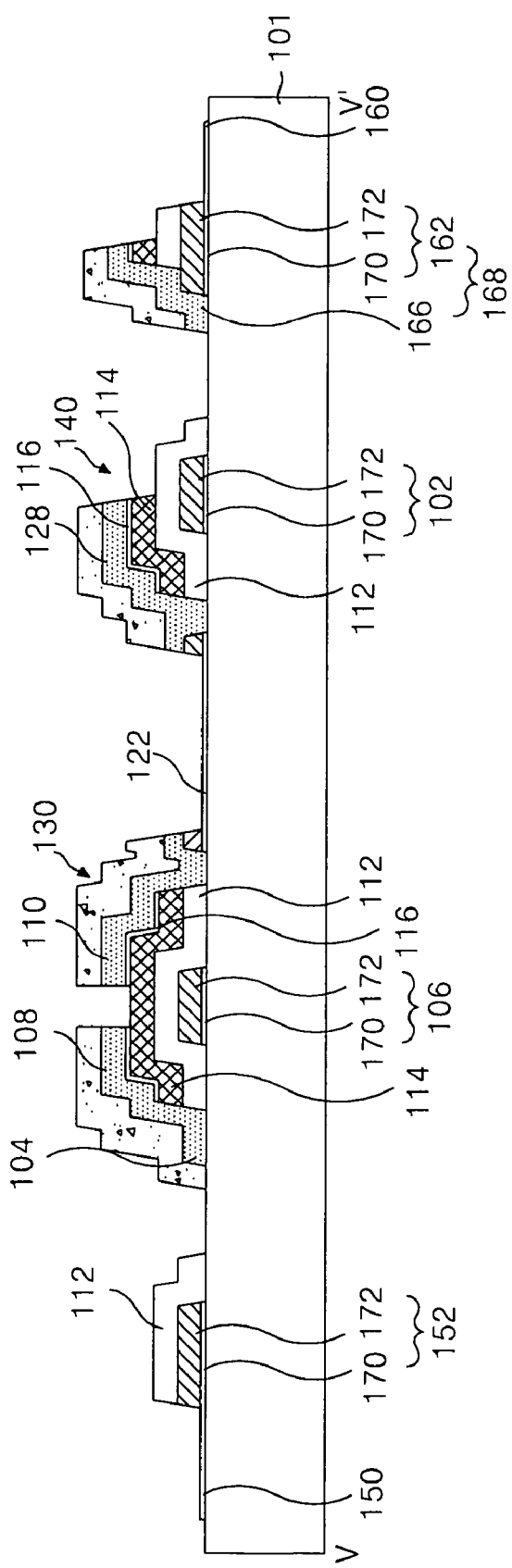
Figure 10D:
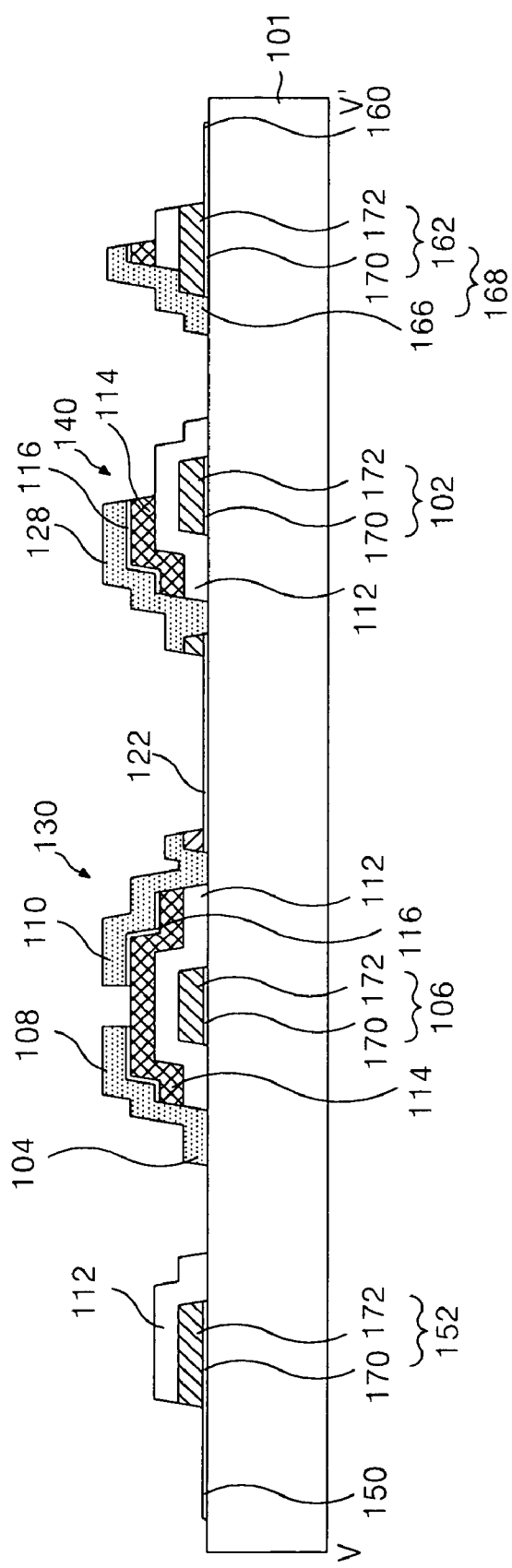

Referring to FIG. 10C, after the active and ohmic contact layers 114 and 116 are formed, the portion of the photo-resist pattern 230 having the relatively lower height (i.e., the portion of the photo-resist pattern 230 arranged within the channel region of the subsequently formed TFT 130, formed via the partial-exposure area S3 of the third mask pattern 220) may be removed in an ashing process using oxygen (O2) plasma. Upon performing the ashing process, the relatively thicker portions of the photo-resist pattern 230 (i.e., portions of the photo-resist pattern 320 arranged outside the channel region of the subsequently formed TFT 130, formed via the shielding areas S2) are thinned but, nevertheless, remain. Using the thinned photo-resist pattern 230 as a mask, portions of the data metal layer 109 and the ohmic contact layer 116 in the channel portion of the subsequently formed TFT 130 are removed in an etching process. As a result, the active layer 114 within the channel portion is exposed and the source electrode 108 is disconnected from the drain electrode 110. With reference to FIG. 10D, the remaining photo-resist pattern 230 is then removed in a stripping process.

Figure 10E:
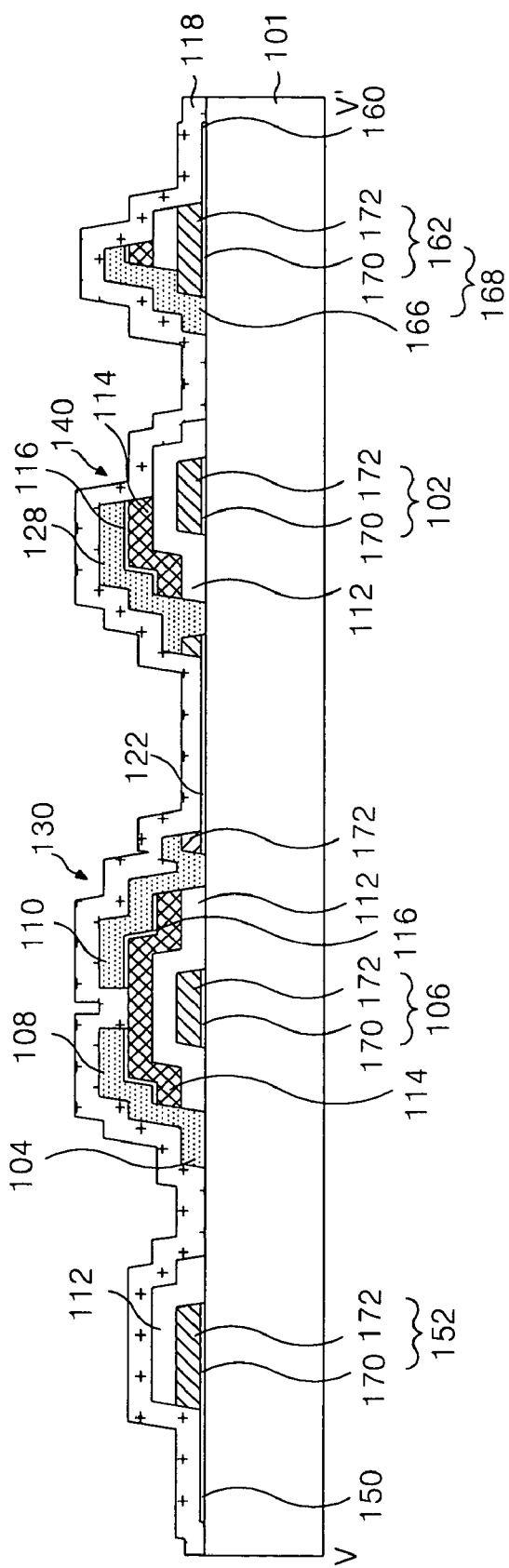

Referring next to FIG. 10E, the protective film 118 is formed over the entire surface of the substrate 101 and on the data pattern. In one aspect of the present invention, the protective film 118 may, for example, include an inorganic insulating material such as silicon nitride (SiNx), silicon oxide (SiOx), or the like, or combinations thereof, an organic insulating material such as acrylic organic compound having a small dielectric constant, BCB (benzocyclobutene), or PFCB (perfluorocyclobutane), or the like, or combinations thereof.

Figure 11:
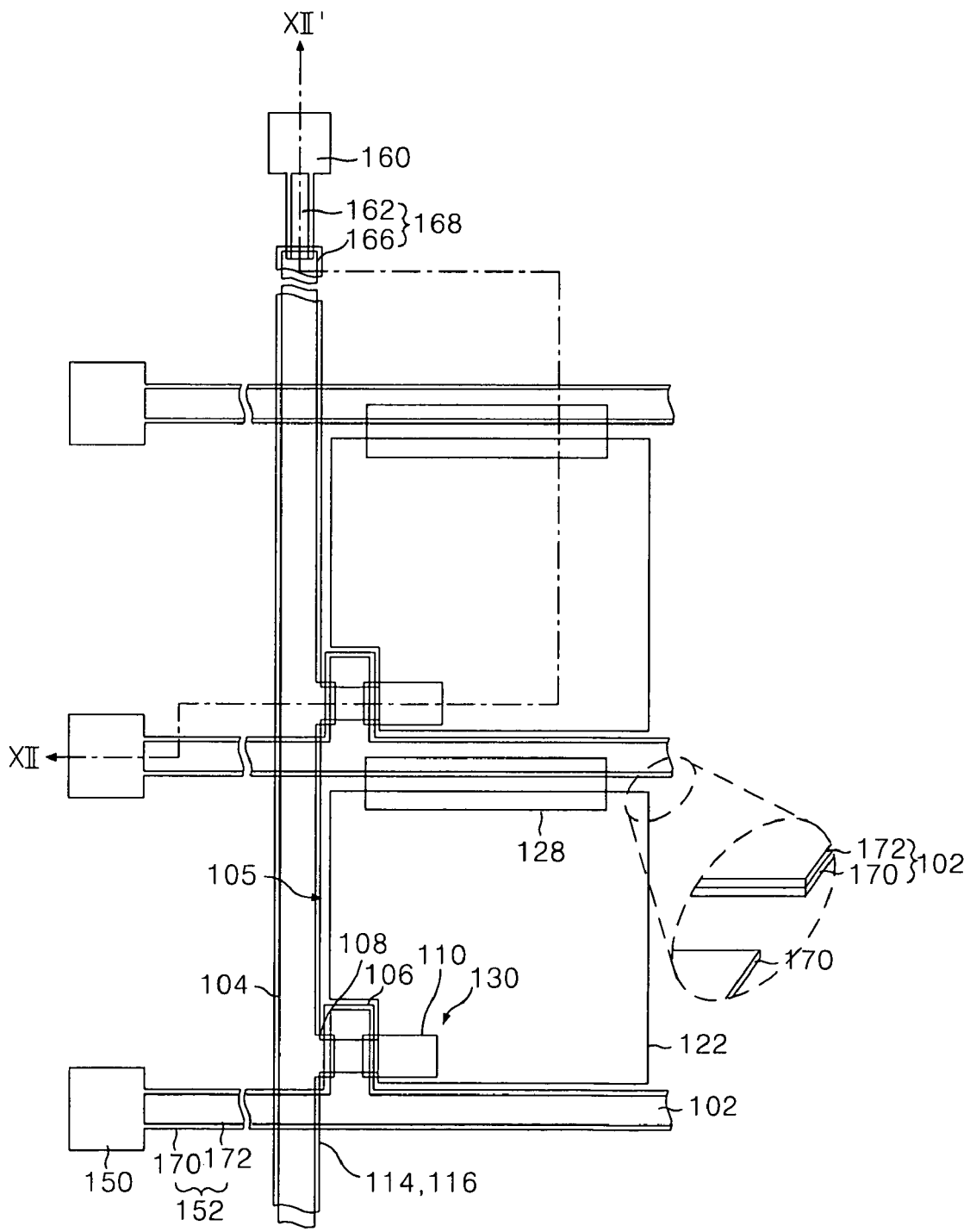
FIG. 11 illustrates a plan view of a portion of a TFT array substrate according to a second embodiment of the present invention.
Figure 12:
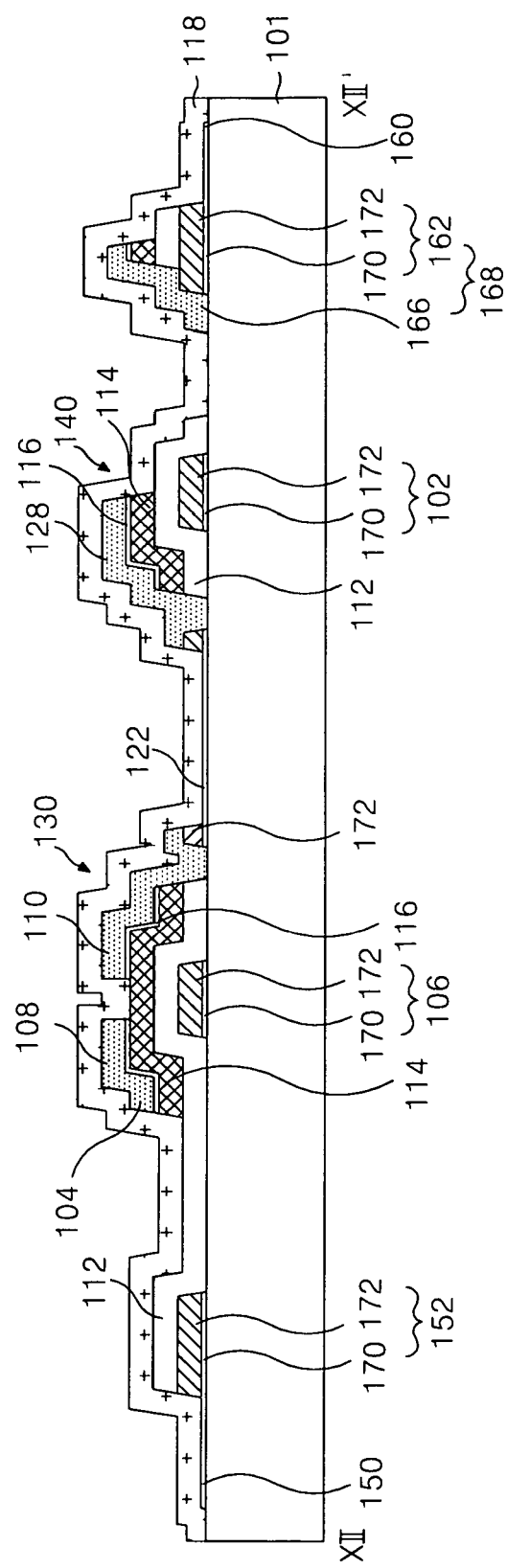
FIG. 12 illustrates a sectional view of the TFT array substrate taken along line XII-XII' shown in FIG. 11.

FIG. 11 illustrates a plan view of a portion of a TFT array substrate according to a second embodiment of the present invention. FIG. 12 illustrates a sectional view of the TFT array substrate taken along line XII-XII' shown in FIG. 11.

The TFT array substrate shown in FIGS. 11 and 12, and method of fabricating the same, is, in many respects, similar to the TFT array substrate shown in FIGS. 4 and 5 but is different with respect to the semiconductor pattern. Thus, for the sake of brevity, a detailed explanation of elements similar to both the second and first embodiments will be omitted.

Referring to FIGS. 11 and 12, a channel is formed within the active layer 114 of the semiconductor layer 112 between the source electrode 108 and the drain electrode 110. The ohmic contact layer 116 is formed over the active layer 114 for ohmically contacting the data line 104, the source electrode 108, the drain electrode 110, the storage electrode 128, and the upper data link electrode 166. Such a semiconductor pattern is formed separately between the cells to thereby prevent signal interference between the cells caused by the semiconductor pattern.

A portion of the pixel electrode 122 that is overlapped by the drain electrode 110 and the storage electrode 128 may comprise the transparent conductive material 170 and gate metal material 172 while the portion of the pixel electrode 122 within the pixel area 105 may comprise only the transparent conductive material 170.

Figure 13A:
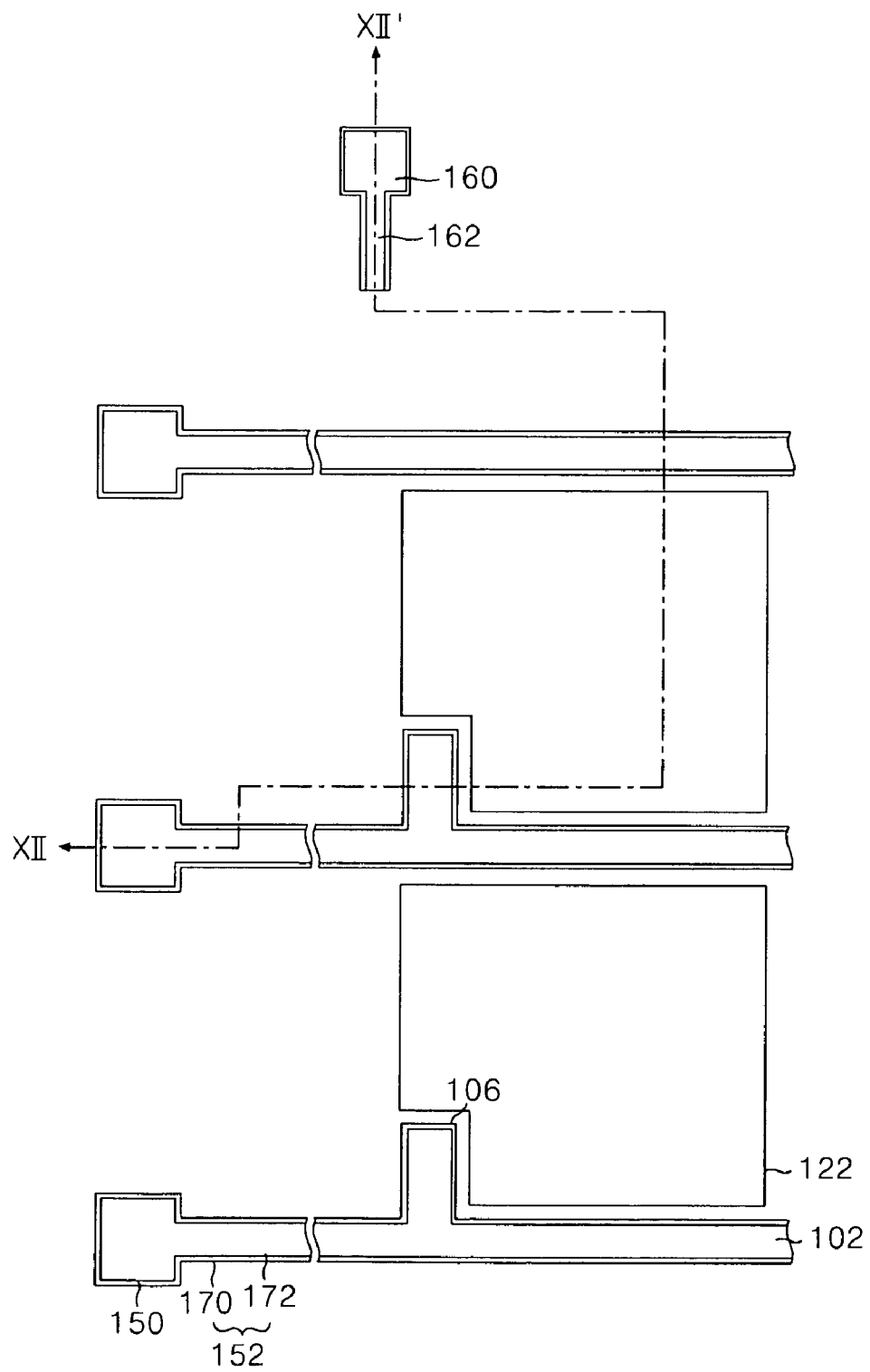
FIGS. 13A and 13B illustrate plan and sectional views, respectively, describing a first mask process in the method of fabricating the TFT array substrate according to the second embodiment of the present invention.
Figure 13B:
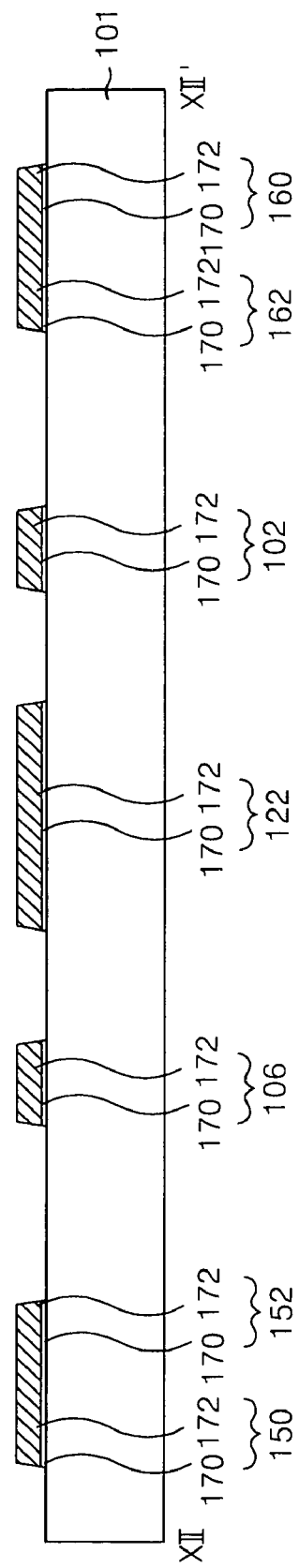

FIG. 13A and FIG. 13B are a plan view and a section view for explaining a first mask process, respectively, in a method of fabricating the lower array substrate according to the second embodiment of the present invention.

Referring to FIG. 13A, the pixel electrode 122 and the aforementioned gate pattern may be formed on the lower substrate 101 in a first mask process. In one aspect of the present invention, the gate pattern may, for example, include the gate line 102, the gate electrode 106, the gate link 152, the gate pad 150, the data pad 160, and the lower data link electrode 162.

According to principles of the present invention, the gate pattern may comprise the double-layer structure of the transparent conductive material 170 and the overlaying gate metal material 172. In one aspect of the present invention, the double-layer structure may be formed by sequentially depositing the transparent conductive material 170 and the gate metal material 172 on the lower substrate 101 by a technique such as sputtering, or the like. In another aspect of the present invention, the transparent conductive material 170 may include a material such as indium-tin-oxide (ITO), tin-oxide (TO), indium-zinc-oxide (IZO) or indium-tin-zinc-oxide (ITZO), or the like, or combinations thereof. In still another aspect of the present invention, the gate metal material 172 may include a material such as an aluminum group metal (e.g., aluminum/neodymium (AlNd), etc.) molybdenum (Mo), copper (Cu), chrome (Cr), tantalum (Ta), titanium (Ti), or the like, or combinations thereof. The transparent conductive material 170 and gate metal material 172 may be patterned using photolithographic and etching techniques using a first mask pattern to provide the aforementioned gate pattern and pixel electrode 122.

Figure 14A:
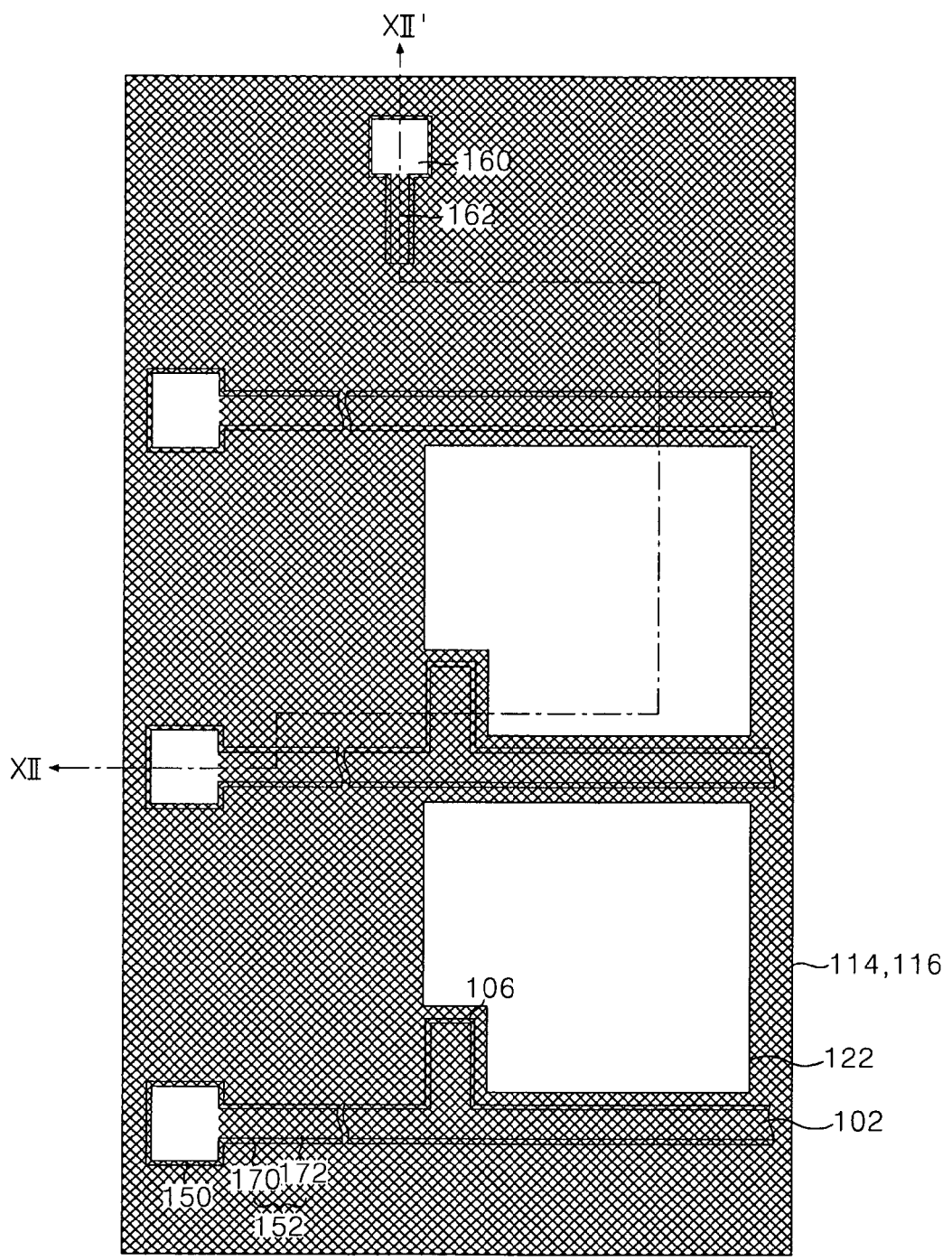
FIGS. 14A and 14B illustrate plan and sectional views, respectively, describing a second mask process in the method of fabricating the TFT array substrate according to the second embodiment of the present invention.
Figure 14B:
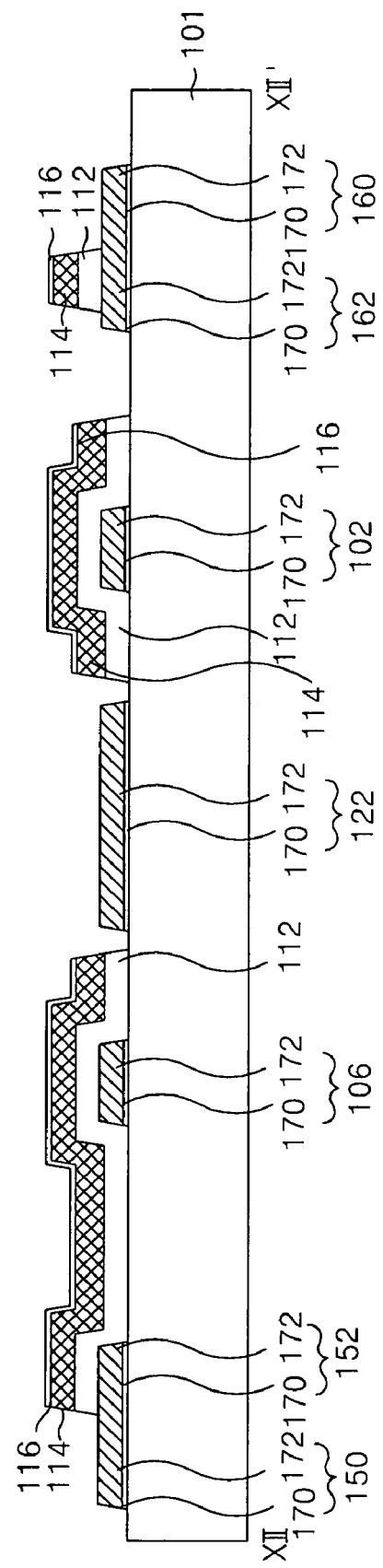

FIGS. 14A and 14B illustrate plan and sectional views, respectively, describing a second mask process in the method of fabricating the TFT array substrate according to the second embodiment of the present invention.

Referring to FIGS. 14A and 14B, the gate insulating pattern 112 and a semiconductor pattern including the active and ohmic contact layers 114 and 116 are formed on the lower substrate 101 in a second mask process. According to principles of the present invention, the gate insulating pattern 112 and the active and ohmic contact layers 114 and 116 are formed to expose the gate pad 150, the data pad 160, the lower data link electrode 162, and the pixel electrode 122.

For example, a gate insulating film, a first semiconductor layer, and a second semiconductor layer may be sequentially formed over the entire surface of the lower substrate 101. In one aspect of the present invention, the gate insulating film, and first and second semiconductor layers may be formed according to a deposition technique such as PEVCD, sputtering, or the like. In another aspect of the present invention, the gate insulating film may, for example, include an inorganic insulating material such as silicon nitride (SiNx) or silicon oxide (SiOx). In another aspect of the present invention, the first semiconductor layer may, for example, include undoped amorphous silicon. In still another aspect of the present invention, the second semiconductor layer may, for example, include N- or P-doped amorphous silicon.

The gate insulating film and the first and second semiconductor layers may then be patterned by aligning a second mask over the lower substrate 101 and applying the photolithography and etching techniques to form the gate insulating pattern 112 and the overlaying semiconductor pattern. In one aspect of the present invention, the gate insulating pattern may overlap the gate line 102, the gate electrode 106, the gate link 152 and the data link 162. In another aspect of the present invention, the semiconductor pattern may include the active and ohmic contact layers 114 and 116 and have the same pattern the gate insulating pattern 112.

Figure 15A:
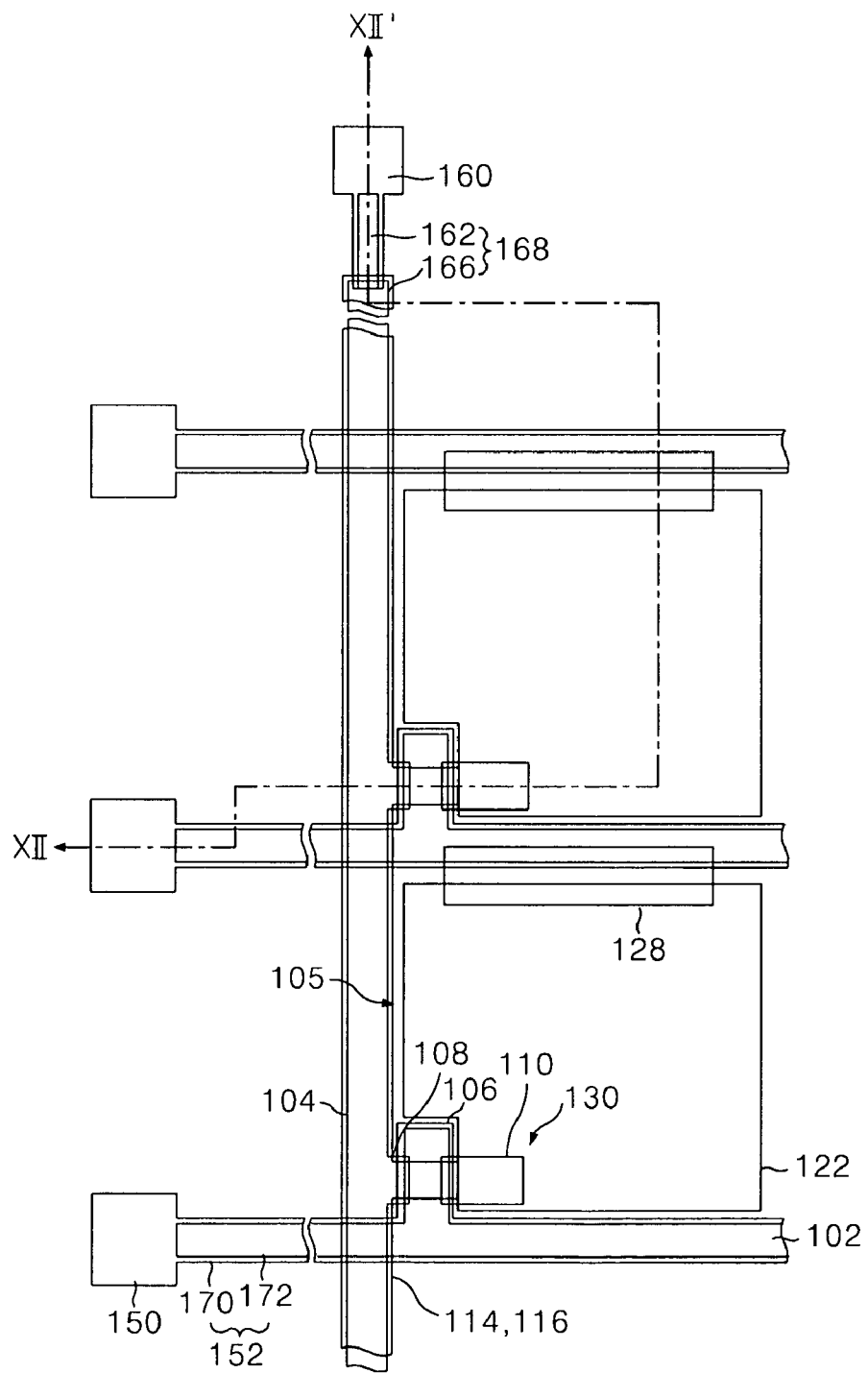
FIGS. 15A and 15B illustrate plan and sectional views, respectively, generally describing a third mask process in the method of fabricating the TFT array substrate according to the second embodiment of the present invention.
Figure 15B:
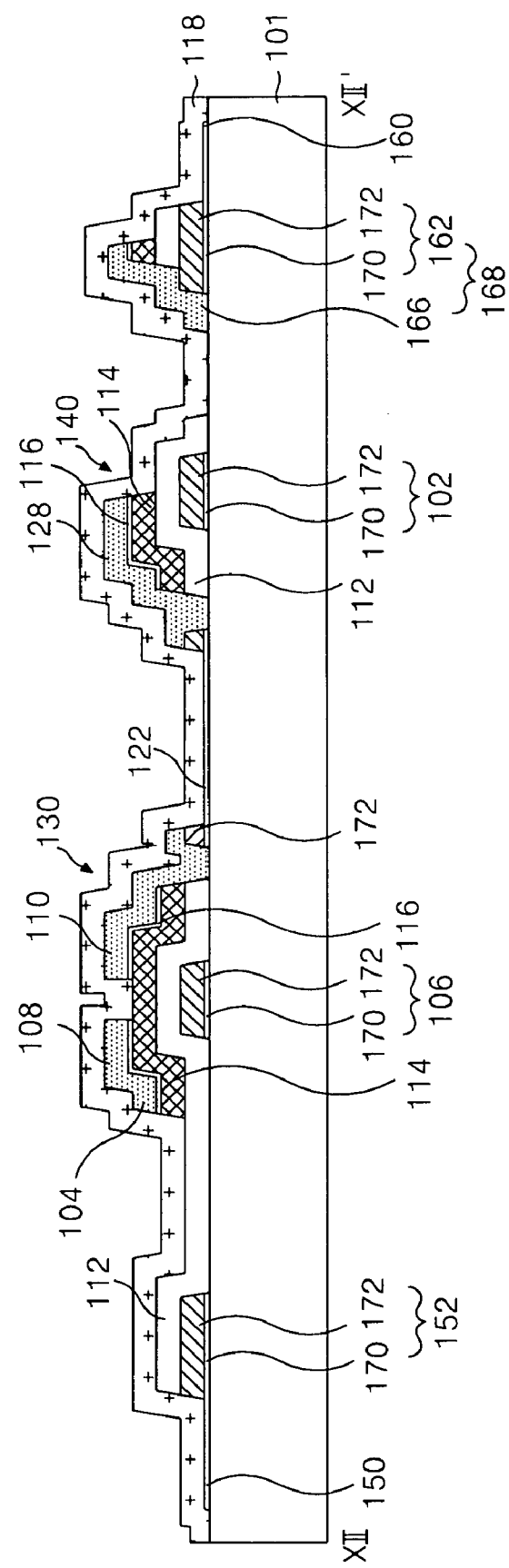

FIGS. 15A and 15B illustrate plan and sectional views, respectively, generally describing a third mask process in the method of fabricating the TFT array substrate according to the second embodiment of the present invention.

Referring generally to FIGS. 15A-15E, a data pattern may be formed on the lower substrate 101 and on the gate insulating pattern 112, in addition to the active and ohmic contact layers 114 and 116, in a third mask process. In one aspect of the present invention, the data pattern may, for example, include the data line 104, the source electrode 108, the drain electrode 110, the storage electrode 128, and the upper data link electrode 166. In another aspect of the present invention, the data line 104, the source electrode 108, the drain electrode 110, the storage electrode 128, and a lower portion of the upper data link electrode 166 may be formed along the pattern defined by the active and ohmic contact layers 114 and 116. In still another aspect of the present invention, portions of the gate metal material 172 included within the data pad 160, the gate pad 150, and the pixel electrode 122 may, during the third mask process, be removed to expose the transparent conductive material 170 included therein.

The third mask process of the second embodiment described above will now be described in greater detail with reference to FIGS. 16A to 16E.

Figure 16A:
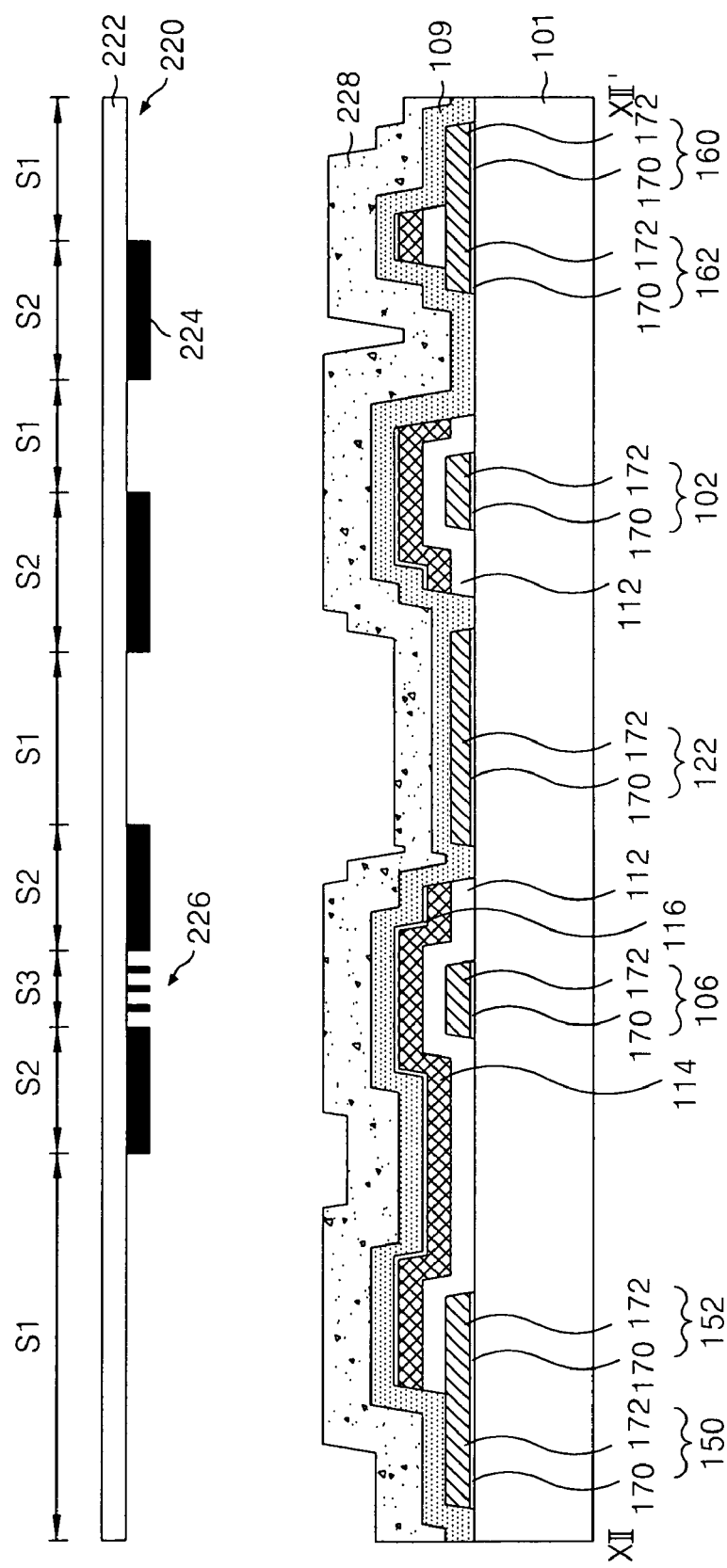
FIGS. 16A to 16E illustrate sectional views specifically describing the third mask process shown in FIGS. 15A and 15B.

Referring to FIG. 16A, a data metal layer 109 may be formed on the lower substrate 101, the gate insulating pattern 112, and on the active and ohmic contact layers 114 and 116. In one aspect of the present invention, the data metal layer 109 may be formed using a deposition technique such as sputtering, or the like. In another aspect of the present invention, the data metal layer 109 may, for example, include a metal such as molybdenum (Mo), copper (Cu), or the like, or combinations thereof.

Subsequently, a photo-resist film 228 is formed over the entire surface of the data metal layer 109 and is photolithographically patterned using a third mask pattern 220. According to principles of the present invention, the third mask pattern 220 is provided as a partial-exposure mask. For example, the third mask pattern 220 may include a mask substrate 222 formed of a suitably transparent material, a plurality of shielding parts 224 within shielding areas S2 on the mask substrate 222, and a partial-exposure part (e.g., a diffractive part or transflective part) 226 within a partial-exposure area S3 on the mask substrate 222. It should be noted that areas of the mask 222 that do not support a shielding or partial-exposure parts are referred to as exposure areas S1.

Figure 16B:
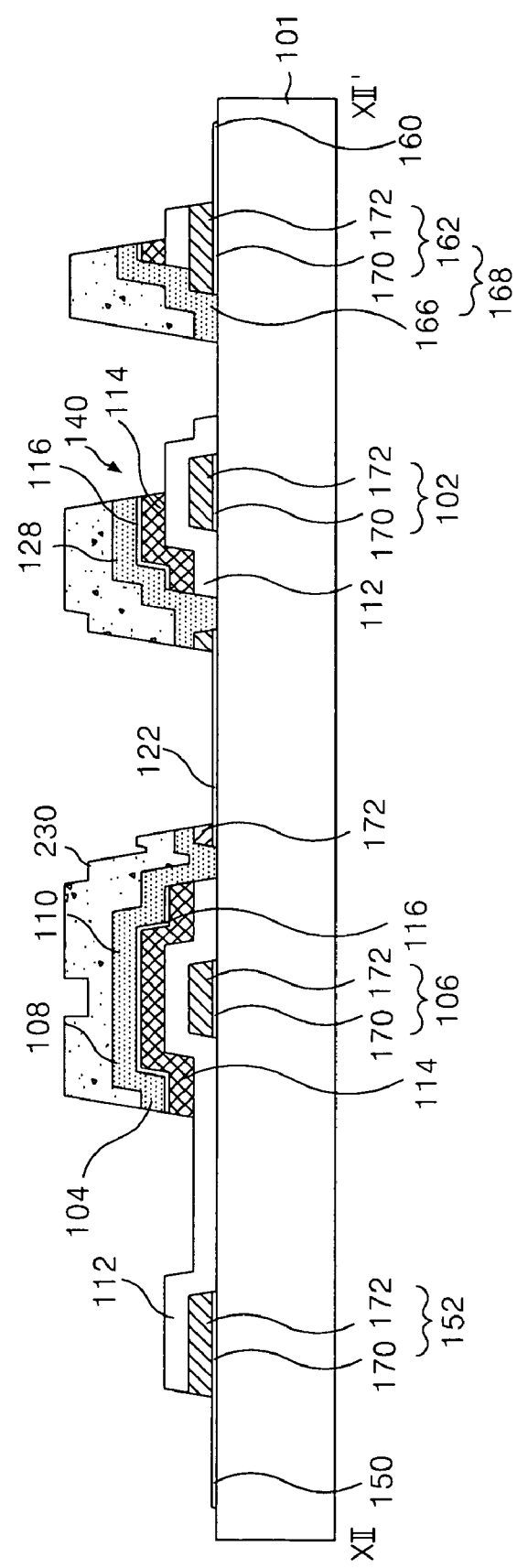

Referring to FIG. 16B, the photo-resist film 228 may, via the third mask pattern 220, be selectively exposed to light through the exposure areas S1 and be developed, thereby creating a photo-resist pattern 230 having a step difference between the shielding and partial-exposure areas S2 and S3. Accordingly, the height of the photo-resist pattern 230 within the partial-exposure area S3 may be lower than the height of the photo-resist pattern 230 within the shielding areas S2.

Subsequently, the photo-resist pattern 230 is used as a mask to pattern the data metal layer 109 in a wet etching technique and form the aforementioned data pattern (i.e., the storage electrode 128, the data line 104, the source electrode 108, the drain electrode 110, and the upper data link electrode 166) wherein the source and drain electrodes 108 and 110 are connected to each other in a region corresponding to partial-exposure area S3 (i.e., the channel region of a subsequently formed TFT 130), wherein the source electrode 108 is connected to one side of the data line 104, and wherein the upper data link electrode 166 is connected to another side of the data line 104.

Using the gate insulating pattern 112 as a mask, portions of the gate metal material 172 included within the data pad 160, the gate pad 150, and pixel electrode 122 may be removed. Additionally, portions of the pixel electrode 122 exposed by the photo-resist pattern 230 may be removed. Accordingly, the gate metal material 172 may remain in areas where the pixel electrode 122 overlaps with the drain electrode 110 and the storage electrode 128.

Next, the photo-resist pattern 230 may be used as a mask to pattern the first and second semiconductor layers in a dry etching process, thereby forming the active and ohmic contact layers 114 and 116. In one aspect of the present invention, the patterning may, for example, include removing portions of the active and ohmic contact layers 114 and 116 that are not overlapped by the data pattern.

Figure 16C:
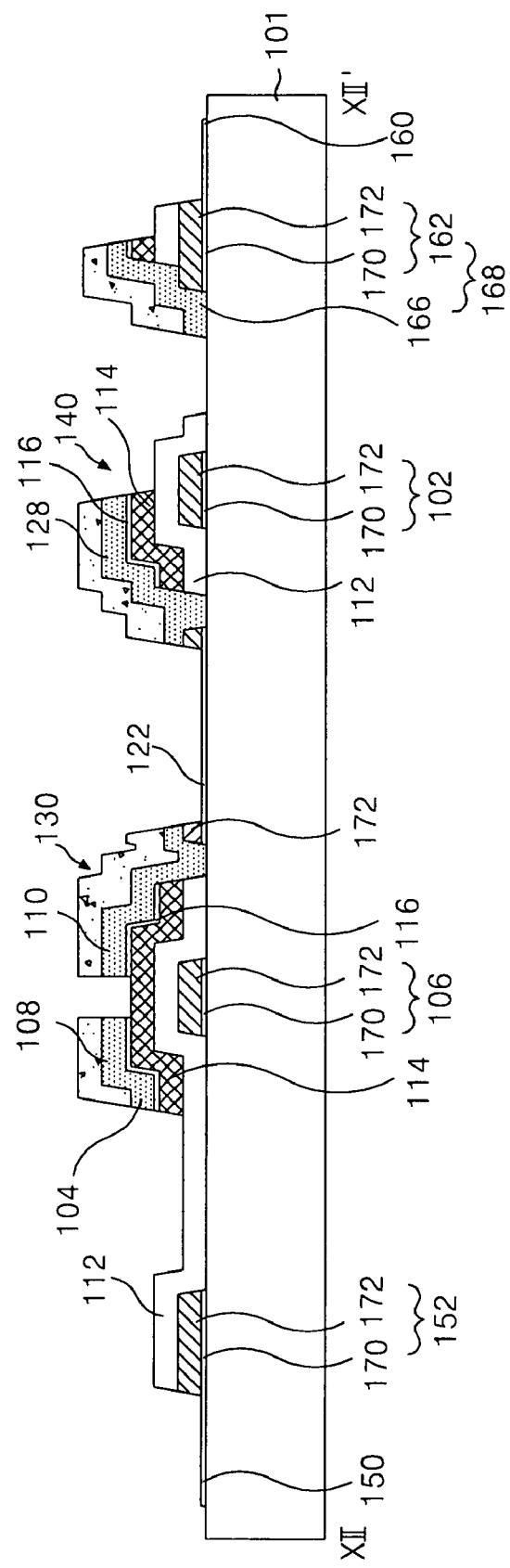
Figure 16D:
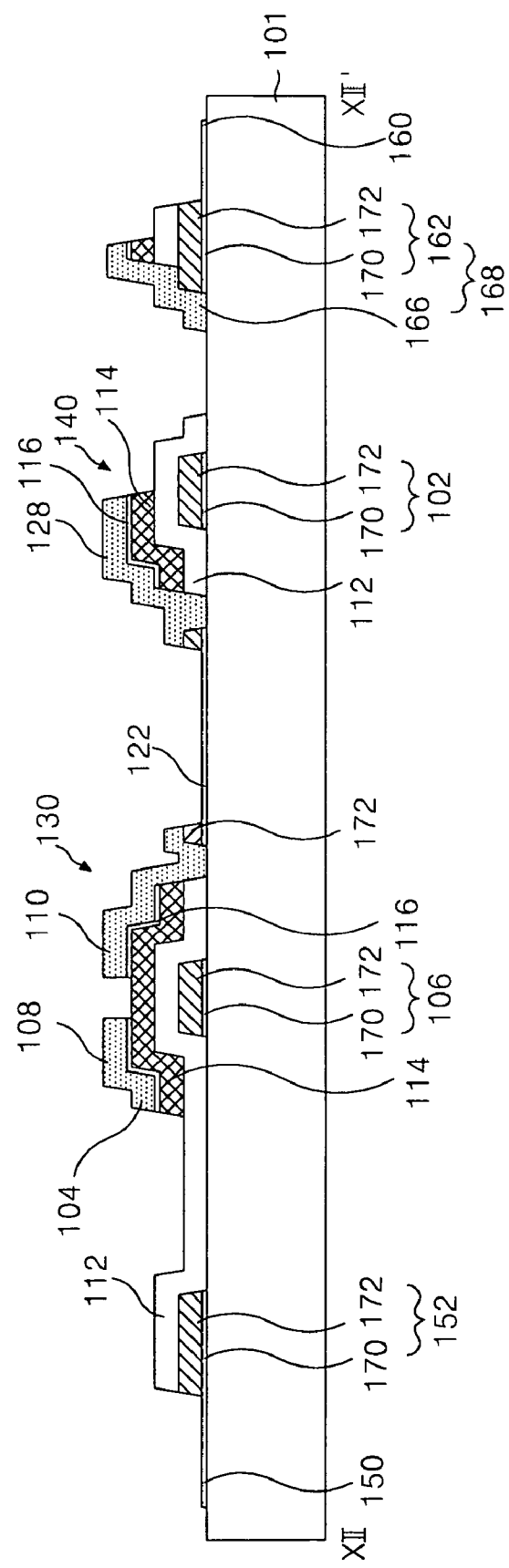

Referring to FIG. 16C, after the active and ohmic contact layers 114 and 116 are formed, the portion of the photo-resist pattern 230 having the relatively lower height (i.e., the portion of the photo-resist pattern 230 arranged within the channel region of the subsequently formed TFT 130, formed via the partial-exposure area S3 of the third mask pattern 220) may be removed in an ashing process using oxygen (O2) plasma. Upon performing the ashing process, the relatively thicker portions of the photo-resist pattern 230 (i.e., portions of the photo-resist pattern 320 arranged outside the channel region of the subsequently formed TFT 130, formed via the shielding areas S2) are thinned but, nevertheless, remain. Using the thinned photo-resist pattern 230 as a mask, portions of the data metal layer 109 and the ohmic contact layer 116 in the channel portion of the subsequently formed TFT 130 are removed in an etching process. As a result, the active layer 114 within the channel portion is exposed and the source electrode 108 is disconnected from the drain electrode 110. With reference to FIG. 16D, the remaining photo-resist pattern 230 is then removed in a stripping process.

Figure 16E:
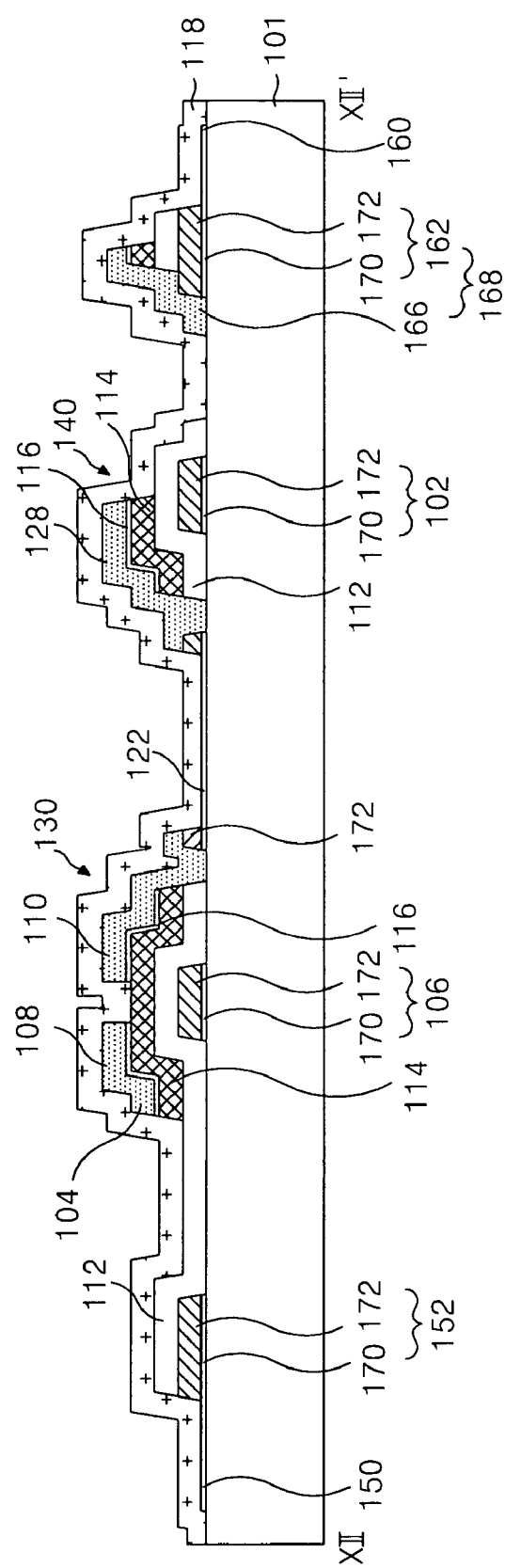

Referring next to FIG. 16E, the protective film 118 is formed over the entire surface of the substrate 101 and on the data pattern. In one aspect of the present invention, the protective film 118 may, for example, include an inorganic insulating material such as silicon nitride (SiNx), silicon oxide (SiOx), or the like, or combinations thereof, an organic insulating material such as acrylic organic compound having a small dielectric constant, BCB (benzocyclobutene), or PFCB (perfluorocyclobutane), or the like, or combinations thereof.

Figure 17:
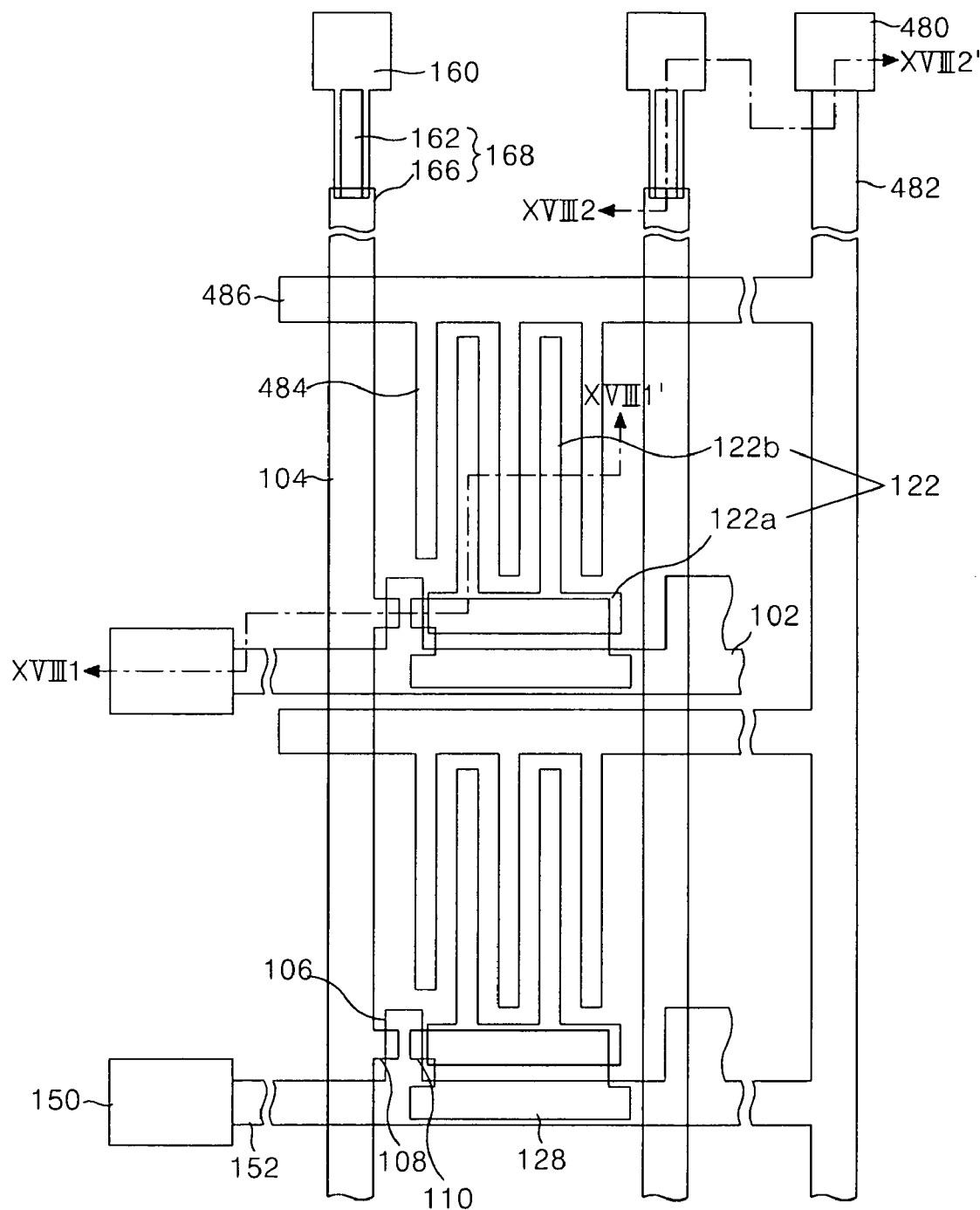
FIG. 17 illustrates a plan view of a TFT array substrate according to a third embodiment of the present invention.
Figure 18:
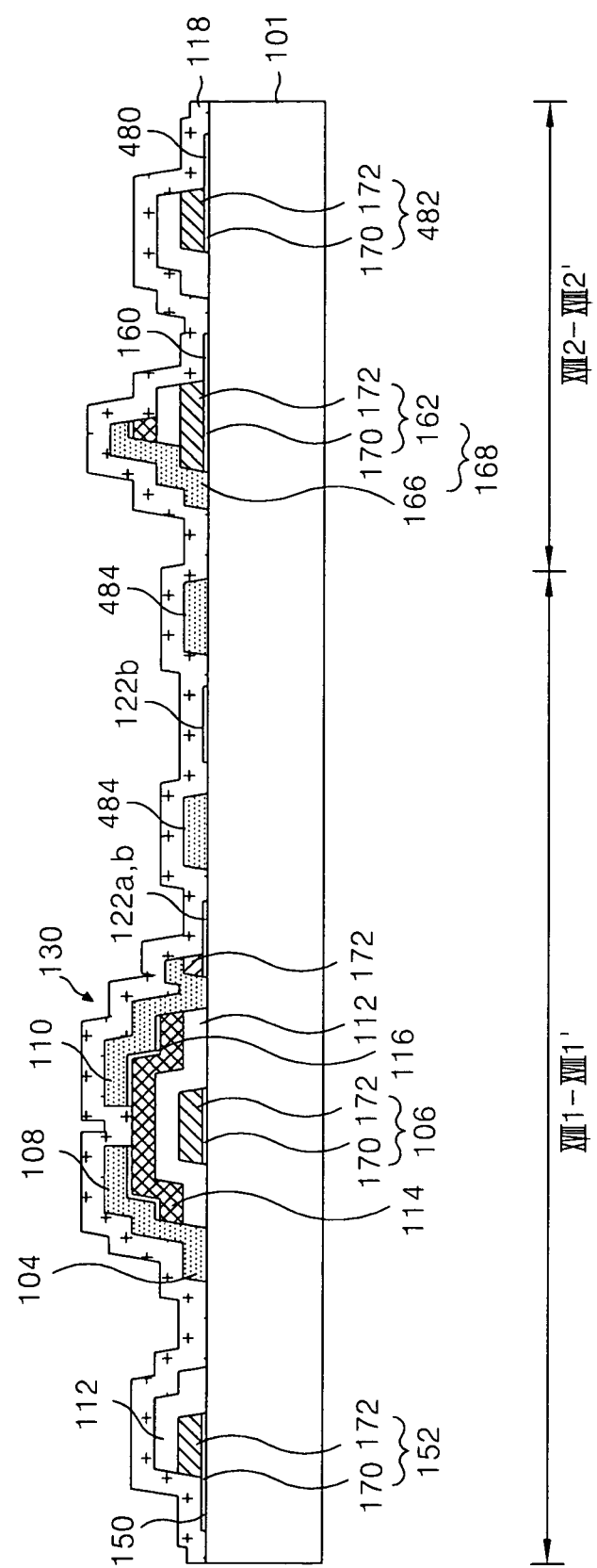
FIG. 18 is illustrates a sectional view of the TFT array substrate taken along lines XVIII1-XVIII1' and XVIII2-XVIII2' shown in FIG. 17.

FIG. 17 illustrates a plan view of a TFT array substrate according to a third embodiment of the present invention. FIG. 18 is illustrates a sectional view of the TFT array substrate taken along lines XVIII1-XVIII1' and XVIII2-XVIII2' shown in FIG. 17.

The TFT array substrate shown in FIGS. 17 and 18, and the method of fabricating the same, is, in many respects, similar to the TFT array substrate shown in FIGS. 4 and 5 but is different with respect to a common electrode provided on the lower substrate. Thus, for the sake of brevity, a detailed explanation of elements similar to both the third and first embodiments will be omitted.

Referring to FIGS. 17 and 18, the TFT array substrate of the third embodiment may, for example, include gate lines 102 and data lines 104 formed so as to cross each other on a lower substrate 101 to define a plurality of pixel areas; a gate insulating pattern 112 formed between the gate and data lines 102 and 104; a thin film transistor 130 at each crossing of the gate and data lines 102 and 104; a pixel electrode 122 and a common electrode 484 arranged at each pixel area, for generating a horizontally oriented electric field; and a common line 486 connected to each common electrode 484. The TFT array substrate may further include a storage capacitor provided at a region where a storage electrode 128 and a gate line 102 overlap, a gate pad 150 extending from each gate line 102, and a data pad 160 extending from each data line 104, and a common pad 480 extending from each common line 486.

The storage capacitor may, for example, a storage capacitor 128 overlapping, and insulated from, the gate line 102 and connected to the pixel electrode 122. Constructed as described above, the storage capacitor 128 allows pixel signals charged at the pixel electrode 122 to be uniformly maintained until a next pixel signal is charged at the pixel electrode 122.

In one aspect of the present invention, the pixel electrode 122 may, for example, include a pixel horizontal part 122a connected to the drain electrode 110 and oriented parallel to an adjacent gate line 102 in addition to a plurality of pixel finger parts 122b oriented substantially perpendicularly with respect to the pixel horizontal part 122a. In another aspect of the present invention, the common electrode 484 is connected to the common line 486 applying a reference voltage for driving the liquid crystal and is oriented parallel to the pixel finger parts 122b in the pixel area. In still another aspect of the present invention, a portion of the pixel electrode 122 that is overlapped by the drain electrode 110 may comprise the transparent conductive material 170 and gate metal material 172 while the portion of the pixel electrode 122 within the pixel area may comprise only the transparent conductive material 170.

Reference voltages may be supplied to each common line 486 via a corresponding common pad 480. Accordingly, each common pad 480 may be connected to an external reference voltage source (not shown) via a common link 482. In one aspect of the present invention, each common pad 480 may comprise the transparent conductive material 170. In another aspect of the present invention, the common link 482 may comprise the transparent conductive material 170 and the overlaying gate metal material 172. In still another aspect of the present invention, at least a portion of the transparent conductive material 170 of the common pad 480 extending from the common link 482 may be exposed by the gate metal material 172.

During operation, a horizontal electric field may be generated between the pixel and common electrodes 122 and 484 when a pixel signal is supplied from a TFT 130 to a pixel electrode 122 and when a reference voltage is supplied from the common line 186 to the common electrode 184. For example, the horizontal electric field may be formed between the plurality of pixel finger parts 122b and the plurality of common finger parts 184b. The liquid crystal molecules have a particular dielectric anisotropy. Therefore, in the presence of the electric field, liquid crystal molecules rotate to align themselves horizontally between the TFT and color filter array substrates. The magnitude of the applied electric field determines the extent of rotation of the liquid crystal molecules. Accordingly, gray scale levels may be displayed by a pixel area by varying the magnitude of the applied electric field.

A method of fabricating the TFT array substrate discussed above with respect to FIGS. 17 and 18 will now be described in greater detail below.

The transparent conductive material 170 and gate metal material 172 are sequentially deposited onto the lower substrate 101. Next, in a first mask process, the transparent conductive and gate metal material 170 and 172 may be patterned using photolithography and etching techniques via a first mask to form a pixel electrode 122 and a gate pattern including the gate electrode 106, the gate line 102, the gate pad 150, the lower data link electrode 162, the common line 486, and the common pad 480.

Next, the gate insulating film and the first and second semiconductor layers may be sequentially deposited on the lower substrate 101, the gate pattern, and the pixel electrode 122. In a second mask process, the gate insulating film and the first and second semiconductor layers may be patterned using photolithography and etching techniques via a second mask to form the gate insulating pattern 112, the active layer 114, and the ohmic contact layer 116.

Next, the data metal layer may be deposited on the lower substrate 101, the gate insulating pattern 112, and the active and ohmic contact layers 114 and 116. In a third mask process, the data metal layer may be and then patterned using photolithography and etching techniques via a third mask to form the source electrode 108, the drain electrode 110, the storage electrode 128, the common electrode 484, and the upper data link electrode 166. Further, the gate metal material 172 may be patterned to expose the portions of the transparent conductive material 170 included within the pixel electrode 122, the gate pad 150, the data pad 160, and the common pad 480.

Figure 19:
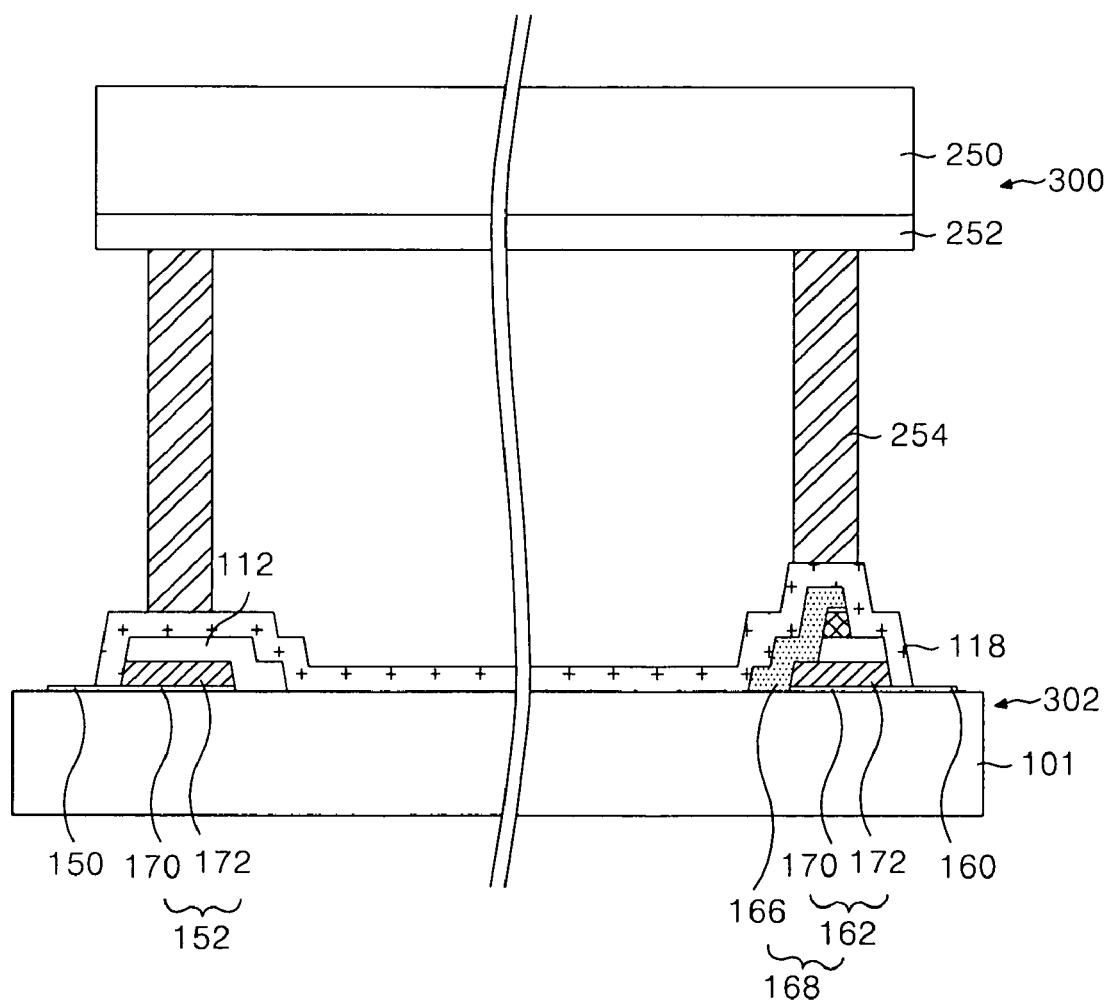
FIG. 19 illustrates a sectional view of a first liquid crystal display (LCD) panel including any of the TFT array substrates according to the first to third embodiments of the present invention.

FIG. 19 illustrates a sectional view of a first liquid crystal display (LCD) panel including any of the TFT array substrates according to the first to third embodiments of the present invention.

Referring to FIG. 19, a liquid crystal display (LCD) panel may, for example, include a color filter array substrate 300 and a TFT array substrate 302 joined to each other by a sealant 254. According to principles of the present invention, the TFT array substrate 302 may be provided as any of the TFT array substrates as described in any of the embodiments described above.

Joined together, the color filter array substrate 300 overlaps the TFT array substrate 302. Further, in one aspect of the present invention, a passivation film 118 may be formed over portions of the TFT array substrate 302 overlapped by the color filter array substrate 300. In another aspect of the present invention, portions of the passivation film 118 and the gate metal material 172 within regions of the TFT array substrate 302 not overlapped by the color filter array substrate 300 may be removed to expose portions of the transparent conductive material 170 included within at least one of the gate pad 150, the data pad 160, and the common pad (not shown).

According to principles of the present invention, the color filter array substrate 300 may, for example, include a color filter array 252 arranged on an upper substrate 250. In one aspect of the present invention, the upper array 252 may, for example, include a black matrix, color filters, and, optionally, a common electrode. For example, when the TFT array substrate 302 is provided as the TFT array substrate described with respect to either the first and second embodiments, the upper array 252 may include a black matrix, color filters, and a common electrode for generating a vertically oriented electric field with respect to the pixel electrode 122. Alternately, when the TFT array substrate 302 is provided as the TFT array substrate described with respect to the third embodiment, the upper array 252 may include only a black matrix and color filters because the common electrode 484 is formed on the TFT array substrate 302 for generating a horizontally oriented electric field with respect to the pixel electrode 122.

A method of fabricating the LCD panel illustrated in FIG. 19 will now be described in greater detail below.

The color filter array substrate 300 and TFT array substrate 302 may be separately prepared and joined to each other via the sealant 254. Using the color filter array substrate 300 as a mask, portions of the passivation film 118 on the surface of the TFT array substrate 302 beyond the color filter array substrate 300 may be patterned in a pad opening process. Accordingly, the pad opening process may expose the transparent conductive material 170 included in at least one of the gate pad 150, the data pad 160, and, optionally, the common pad (not shown).

The aforementioned pad opening process will now be described in greater detail below with respect to FIGS. 20 to 25.

Generally, the aforementioned gate, data, and common pads 150, 160, and 480 formed within pad areas of the lower substrate 101. Accordingly, the portions of the passivation film 118 within the pad areas may not be overlapped, and thus be exposed by the color filter array substrate 300. The exposed passivation film 118 may be etched using a plasma generated by any of the atmosphere plasma generators 260 and 262 shown in FIG. 20 to FIG. 22. Upon being etched, the transparent conductive material 170 within at least one of the gate pad 150, the data pad 160, and the common pad 480 may be exposed by the passivation film 118. In one aspect of the present invention, the etching process may be performed for about one minute, within a temperature range between about 25° C. and about 150° C., at a pressure of about $10^{-2}$ to about 1 bar, and by applying a power of about 300 to about 1200 W. In another aspect of the present invention, the plasma may contain a main gas such as $Cl_2$, $CF_4$, $SF_6$, $CHF_3$, $NF_3$, $O_2$, HF, or the like, and a carrier gas such as He, Ar, or the like. Provided as described above, the atmosphere plasma generators may etch the passivation film 118 containing, for example, $SiN_x$, at a rate of thousands of Å to several μm/min.

Figure 20:
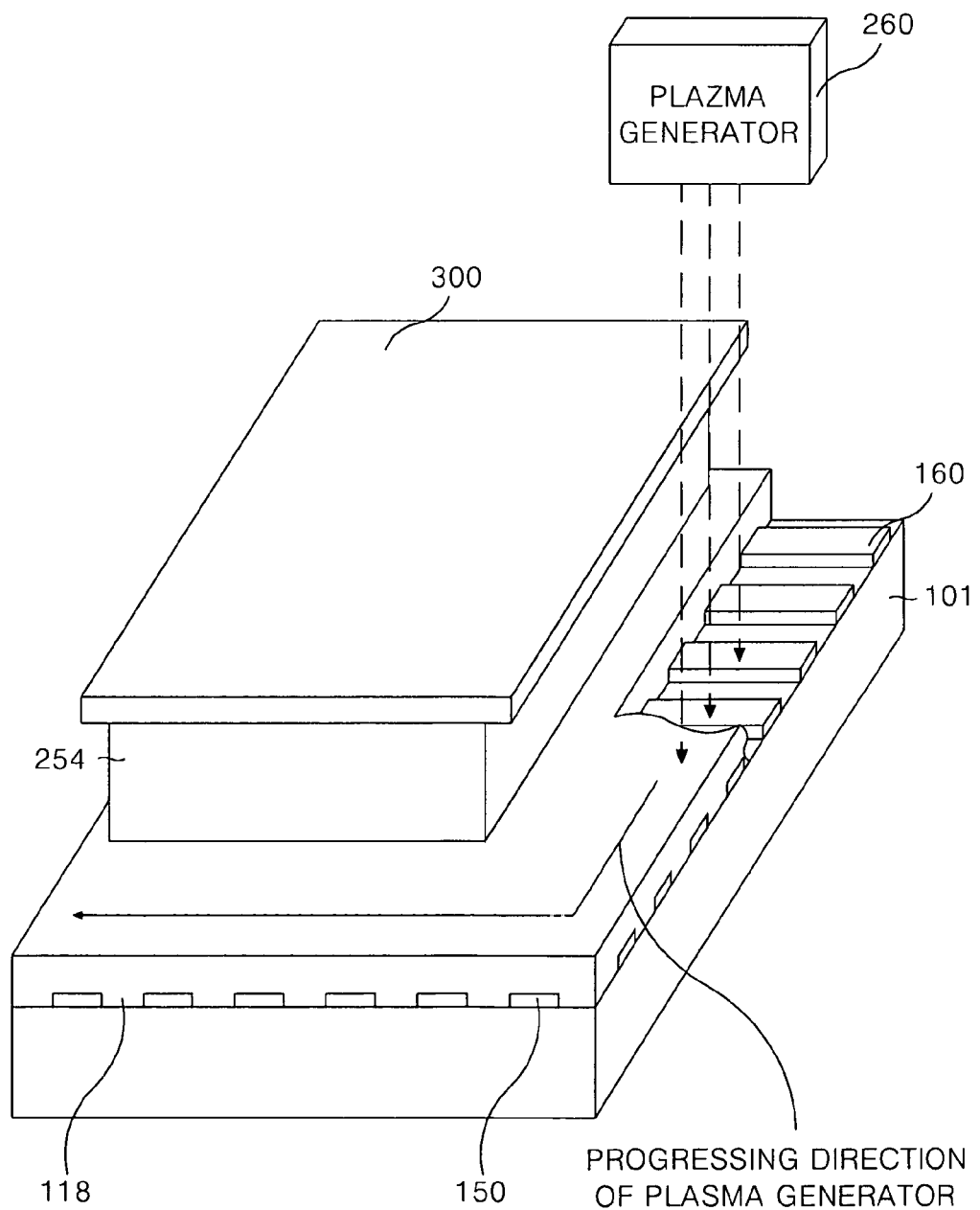
FIGS. 20 to 25 illustrate various pad processes of exposing a portion of a transparent conductive material within the gate and data pads shown in FIG. 19.

Referring to FIG. 20, a beam-shaped atmosphere plasma generator 260 may sequentially scan the pad area of the lower substrate 101 containing the gate and data pads 150 and 160. Accordingly, the atmosphere plasma generator 260 may continuously scan an "L" shaped pattern to sequentially expose portions of the transparent conductive material 170 within individual ones of the gate and data pads 150 and 160.

Figure 21:
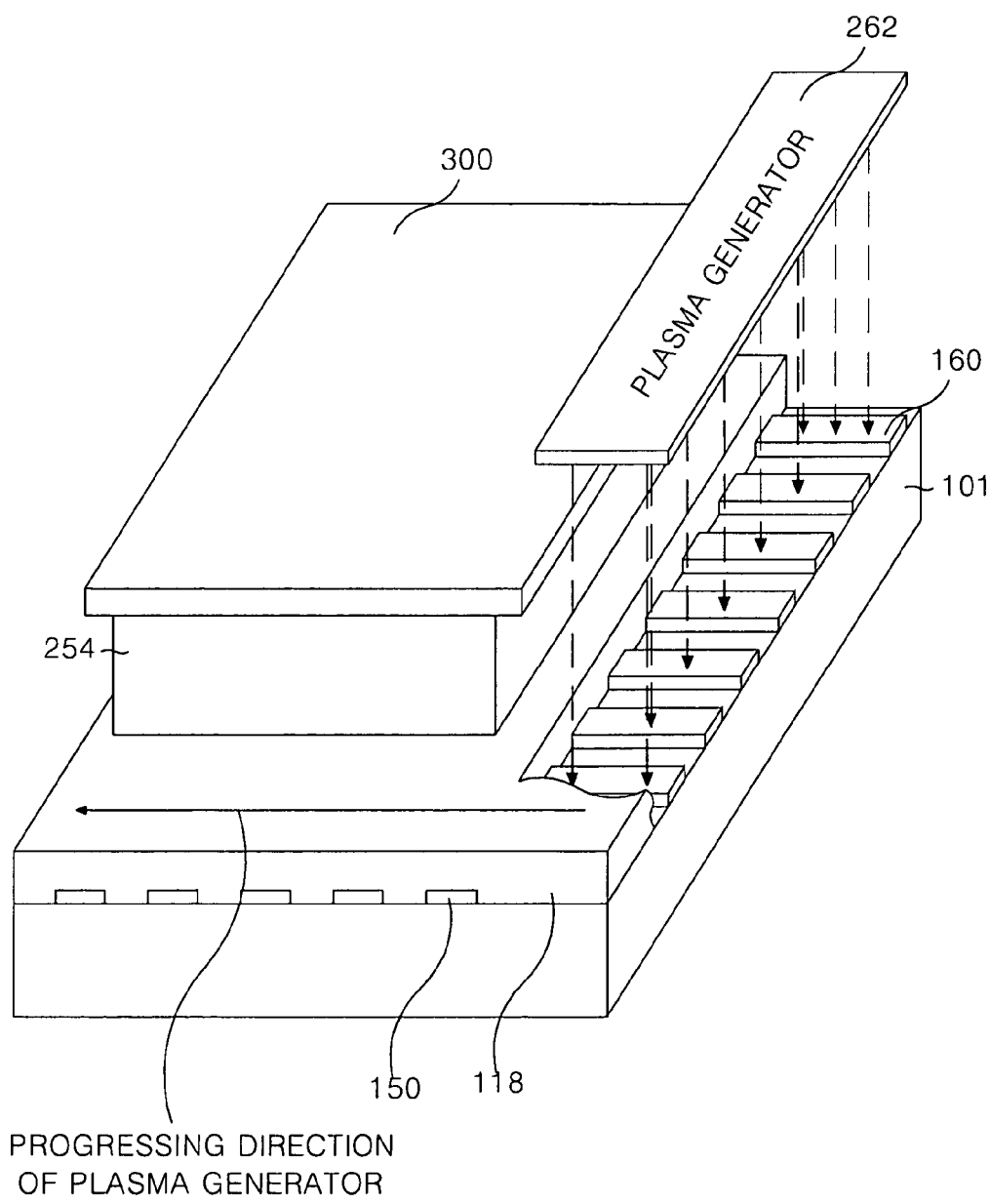

Referring to FIG. 21, a bar-shaped atmosphere plasma generator 262 may perform a first scan of an entirety of one of the gate and data pads 150 and 160 exposed by the color filter array substrate 300 and perform a second scan of an entirety of the other of the gate and data pads 150 and 160. Accordingly, the bar-shaped plasma generator 262 may expose portions of the transparent conductive material 170 within the various gate, data, and common pads 150, 160, 480.

Figure 22A:
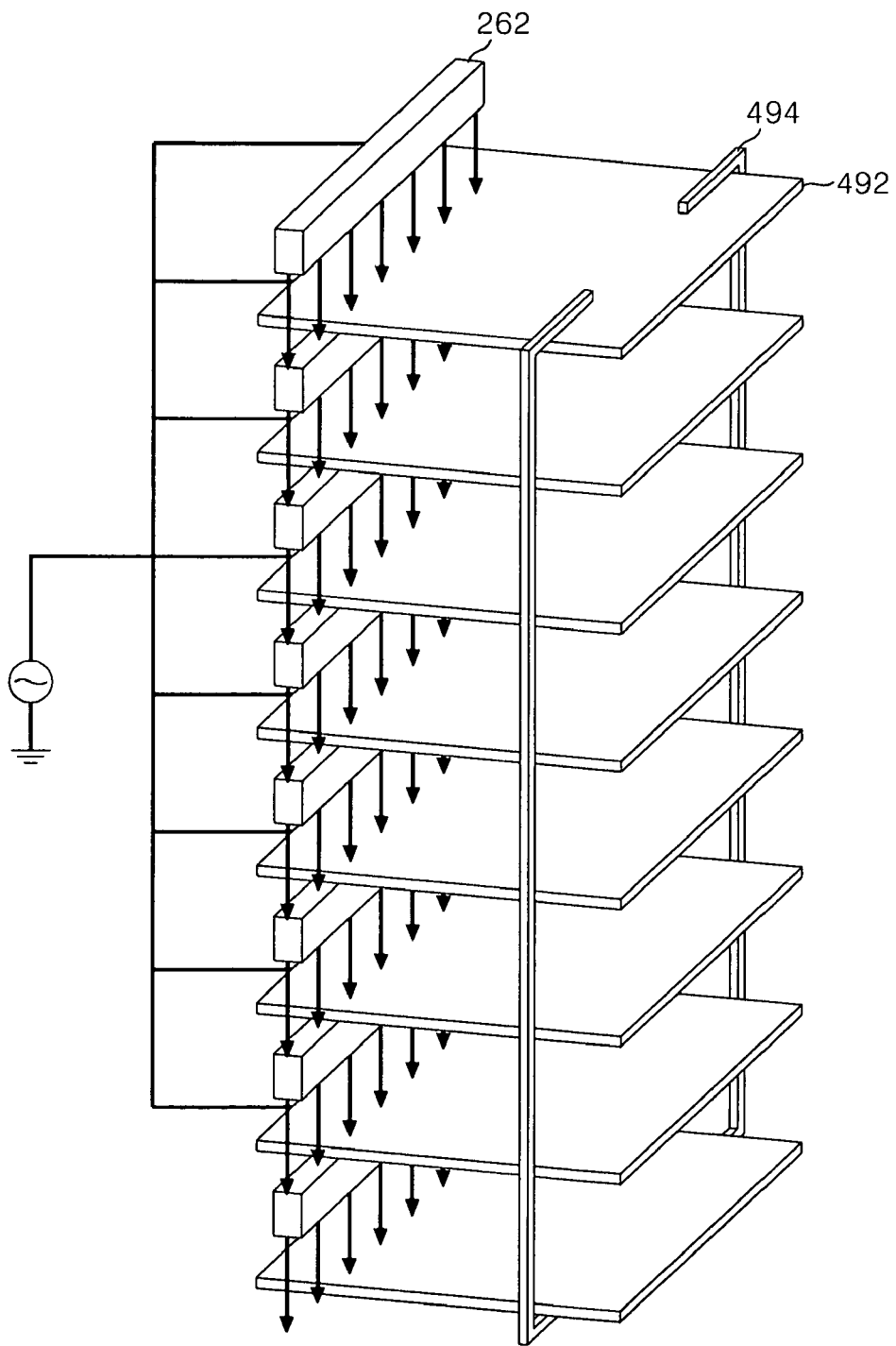

Referring to FIG. 22A, a plurality of atmosphere plasma generators 262 may simultaneously scan pads of a plurality of liquid crystal panels 492 arranged within a cassette 494. For example, a plurality of liquid crystal panels 492 may be loaded into the cassette 494, an atmosphere plasma generator 262 may be arranged within pad areas of the plurality of liquid crystal panels 492, and a plasma may be generated to simultaneously expose portions of the transparent conductive material included within the pad areas of the plurality of liquid crystal panels, thereby shortening the time required to process the plurality of liquid crystal panels.

Figure 22B:
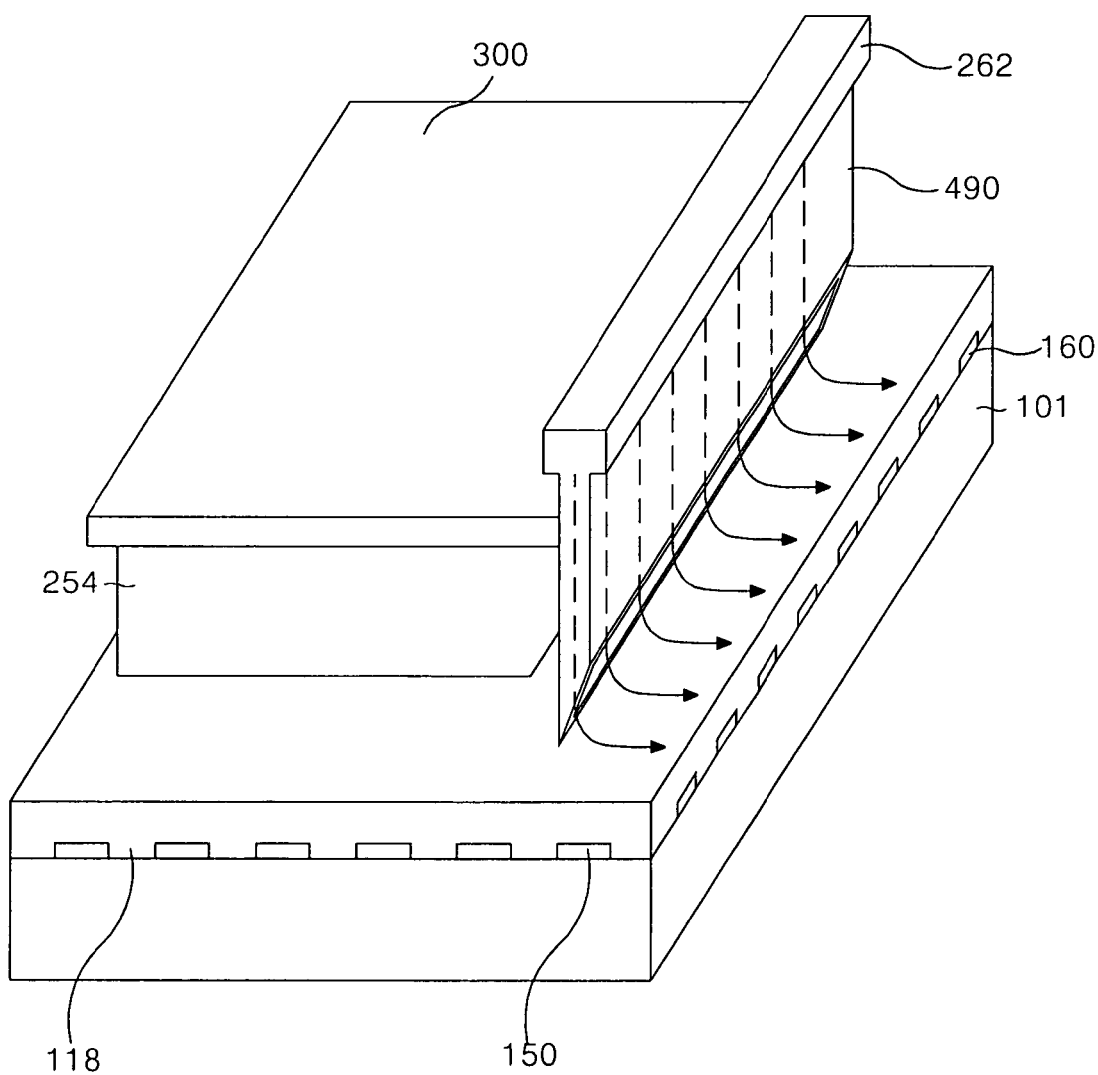

Referring to FIG. 22B, each plasma generator 262 may include a nozzle 490 adjacent to, and extending along, sealant 254. According to principles of the present invention, the nozzle 490 may direct a flow of plasma generated by the atmosphere plasma generator 262 away from the sealant 254, preventing the sealant 254 from becoming damaged during the pad opening process.

Figure 23:
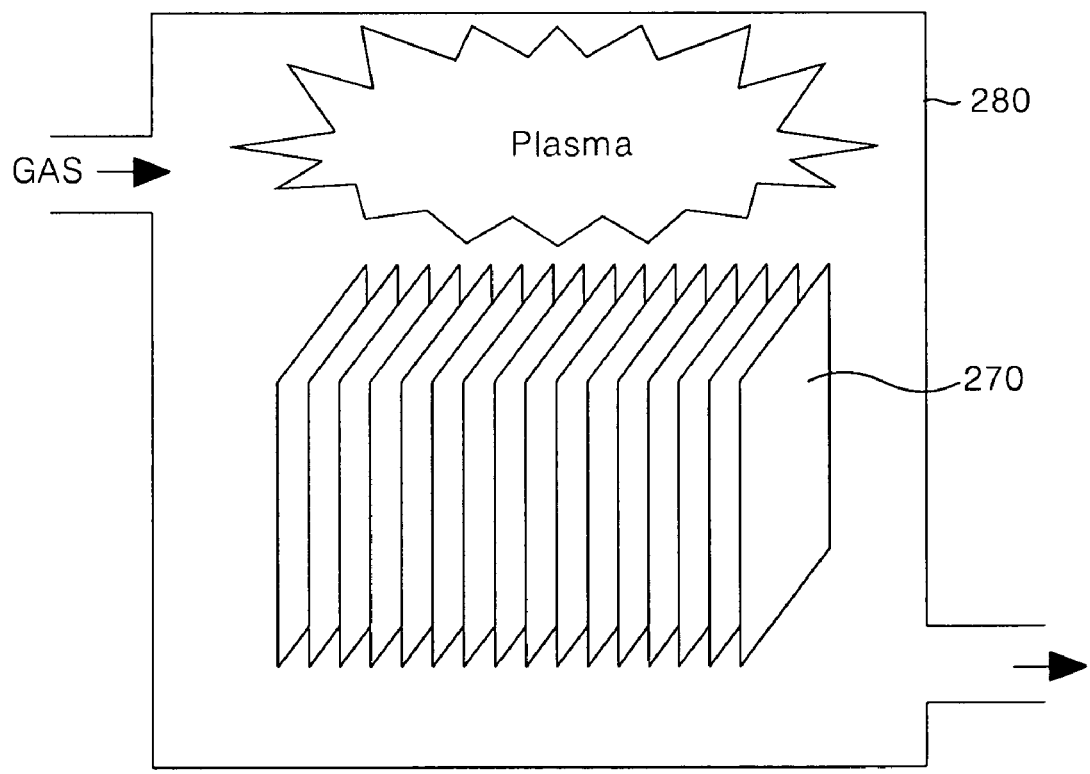
Figure 24:
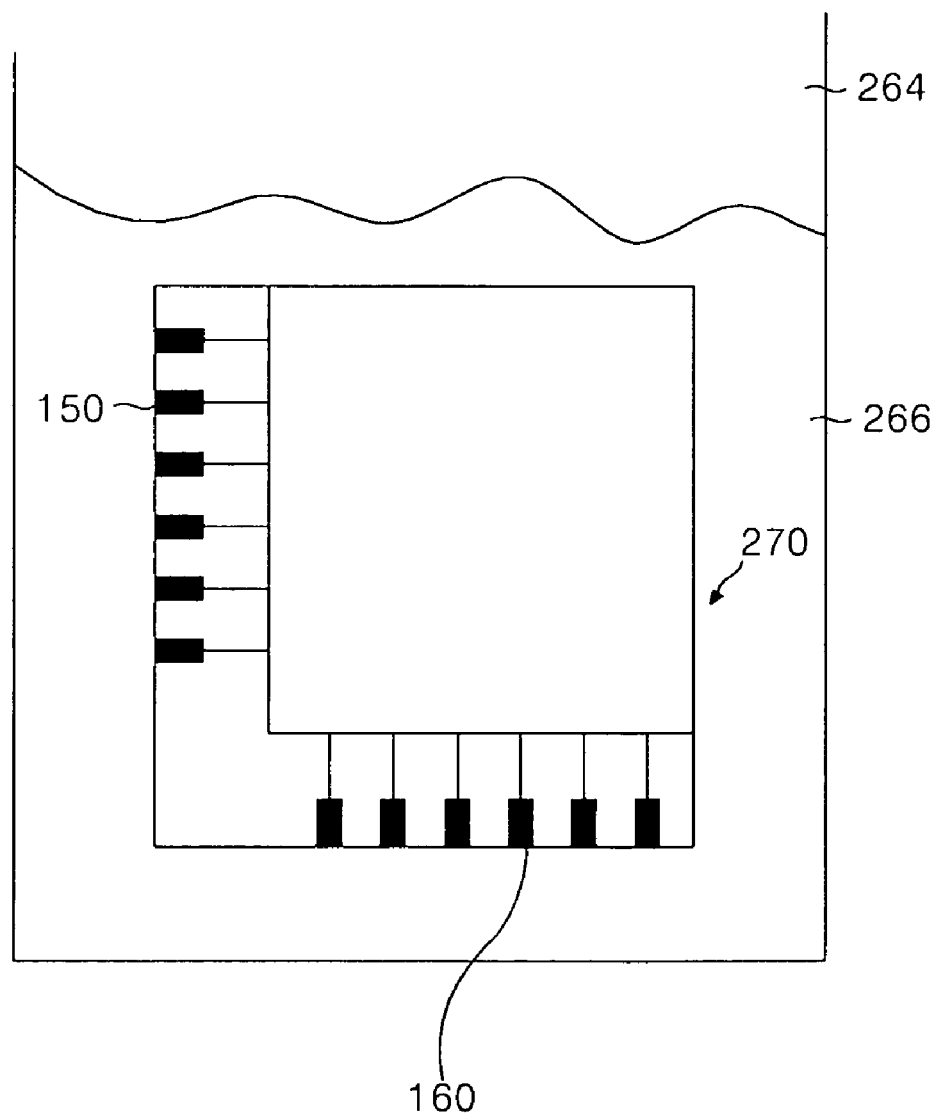
Figure 25:
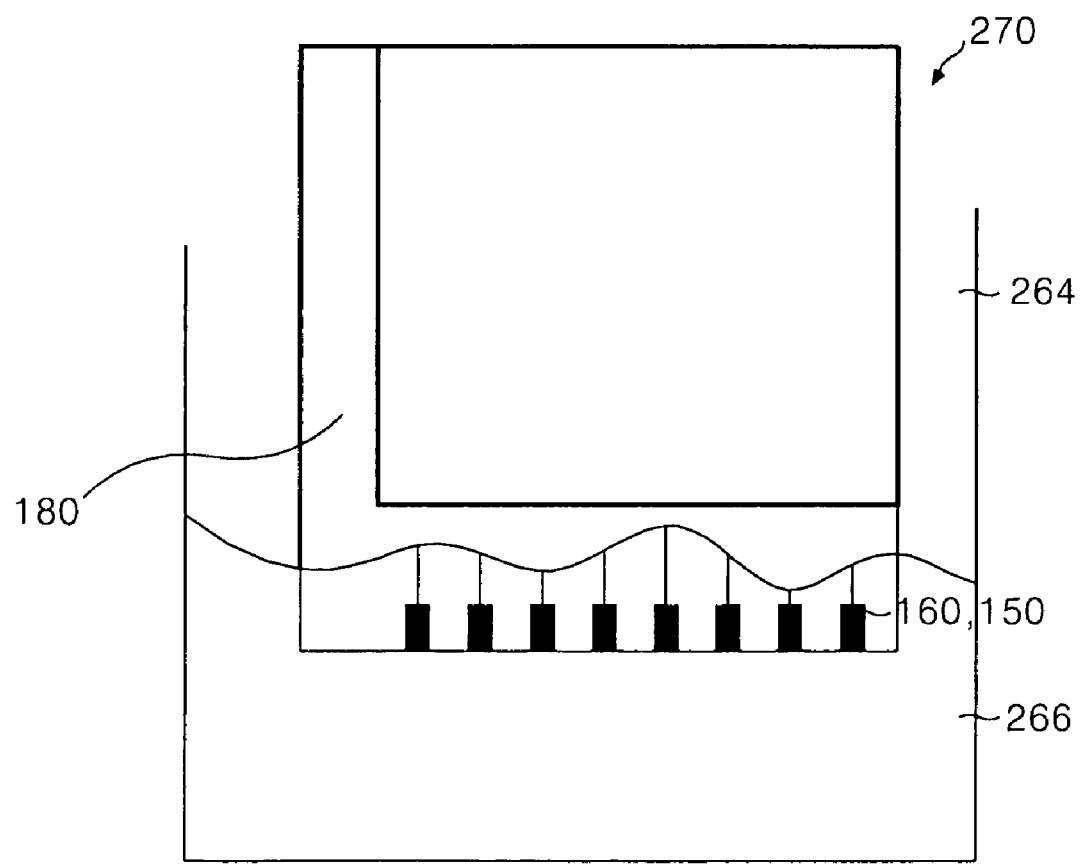

According to principles of the present invention, and with reference to FIG. 23, the pad opening process may, for example, include inserting a plurality of liquid crystal panels 270 into a plasma chamber 280. Next, portions of the passivation film at the pad area of the TFT array substrate exposed by the color filter array substrate are removed (i.e., etched) in a low-pressure plasma discharge such that portions of the transparent conductive material 170 within the various gate, data, and common pads 150, 160, 480 are exposed. In one aspect of the present invention, the etching may be carried out for about one minute within a temperature range between about 25° C. and about 150° C. (e.g., less than about 100° C.), to avoid damaging the liquid crystal panel 270. If the etching is carried out at a temperature above the aforementioned temperature range, the upper and/or lower substrates may warp, an alignment film may become burned, and the sealant 254 may become melted, all producing a defective device.

In an alternate aspect of the present invention, portions of the passivation film 118 at the pad area of the TFT array substrate may be selectively etched using an etching liquid 266. Accordingly, and with reference to FIG. 24, the passivation film 118 may be selectively etched by immersing the entire liquid crystal panel 270 in an etching liquid 266 contained within an etching chamber 264. Upon immersing the liquid crystal panel 270, portions of the transparent conductive material 170 may be simultaneously exposed within the various gate, data, and common pads 150, 160, 480. Alternatively, and with reference to FIG. 25, the liquid crystal panel 270 may be partially immersed in the etching liquid 266 contained within the etching chamber 264. Accordingly, only portions of the liquid crystal panel 270 in which the pad areas are located may be immersed to expose portions of the transparent conductive material 170 within the various gate, data, and common pads 150, 160, 480. In one aspect of the present invention, the etching liquid 266 may, for example, include a boron-oxide group etchant (e.g., HF (HF:DI(purity substance)=20:1) or BOE (buffered oxide etchant), or the like).

Figure 26:
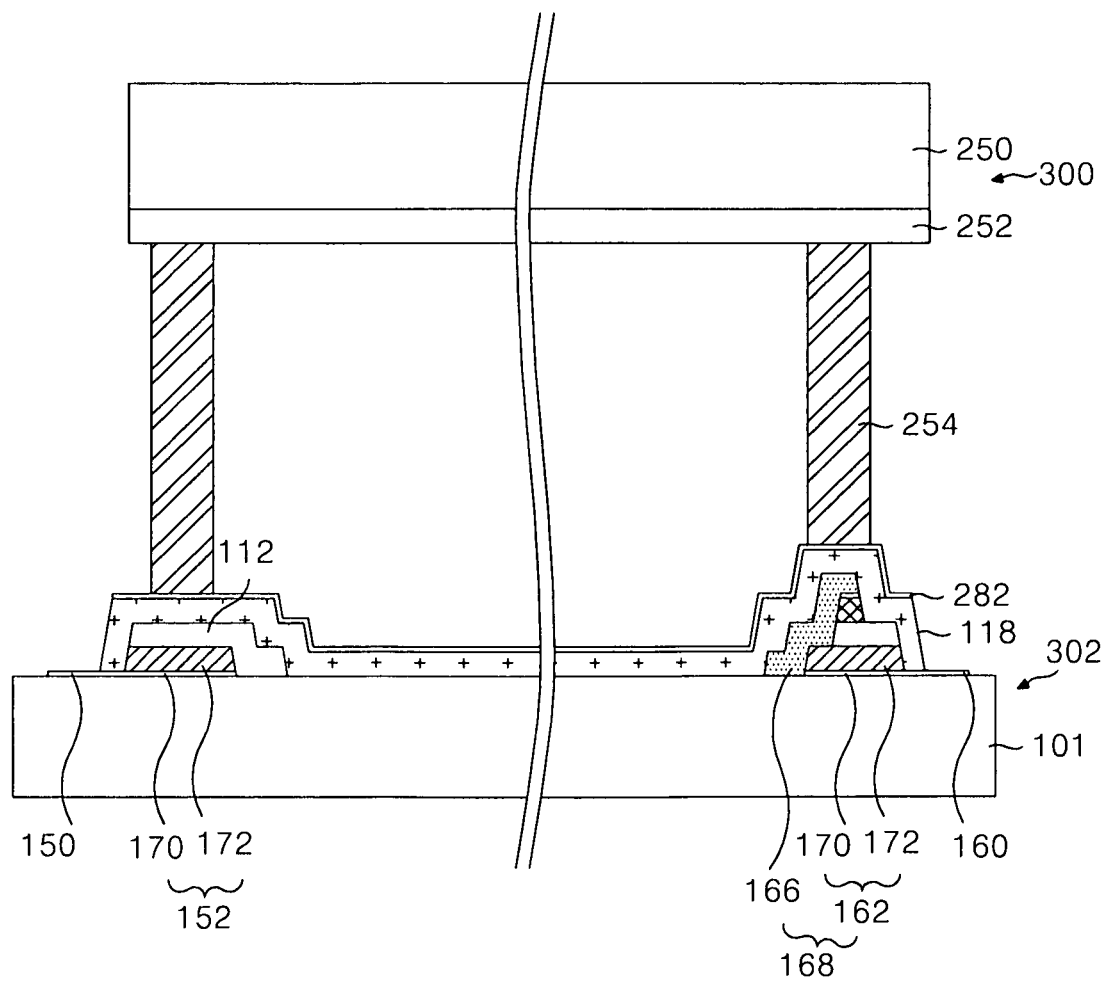
FIG. 26 illustrates a sectional view of a second liquid crystal display (LCD) panel including any of the TFT array substrates according to the first to third embodiments of the present invention.

FIG. 26 illustrates a sectional view a sectional view of a second liquid crystal display (LCD) panel including any of the TFT array substrates according to the first to third embodiments of the present invention.

Referring to FIG. 26, an LCD panel may, for example, include a color filter array substrate 300 and a TFT array substrate 302 joined to each other by a sealant 254. According to principles of the present invention, the TFT array substrate 302 may be provided as any of the TFT array substrates as described in any of the embodiments described above.

Joined together, the color filter array substrate 300 overlaps the TFT array substrate 302. Further, in one aspect of the present invention, an alignment film 282 and a passivation film 118 may be formed over portions of the TFT array substrate 302 overlapped by the color filter array substrate 300. In another aspect of the present invention, portions of alignment film 282, the passivation film 118, and the gate metal material 172 within regions of the TFT array substrate 302 not overlapped by the color filter array substrate 300 may be removed to expose portions of the transparent conductive material 170 included within at least one of the gate pad 150, the data pad 160, and the common pad (not shown).

According to principles of the present invention, the alignment film 282 may be formed over the surface of the protective film 118. Further, the color filter array substrate 300 may, for example, include a color filter array 252 arranged on an upper substrate 250. In one aspect of the present invention, the upper array 252 may, for example, include a black matrix, color filters, and, optionally, a common electrode. For example, when the TFT array substrate 302 is provided as the TFT array substrate described with respect to either the first and second embodiments, the upper array 252 may include a black matrix, color filters, and a common electrode for generating a vertically oriented electric field with respect to the pixel electrode 122. Alternately, when the TFT array substrate 302 is provided as the TFT array substrate described with respect to the third embodiment, the upper array 252 may include only a black matrix and color filters because the common electrode 484 is formed on the TFT array substrate 302 for generating a horizontally oriented electric field with respect to the pixel electrode 122.

A method of fabricating the LCD panel illustrated in FIG. 19 will now be described in greater detail below.

Figure 27A:
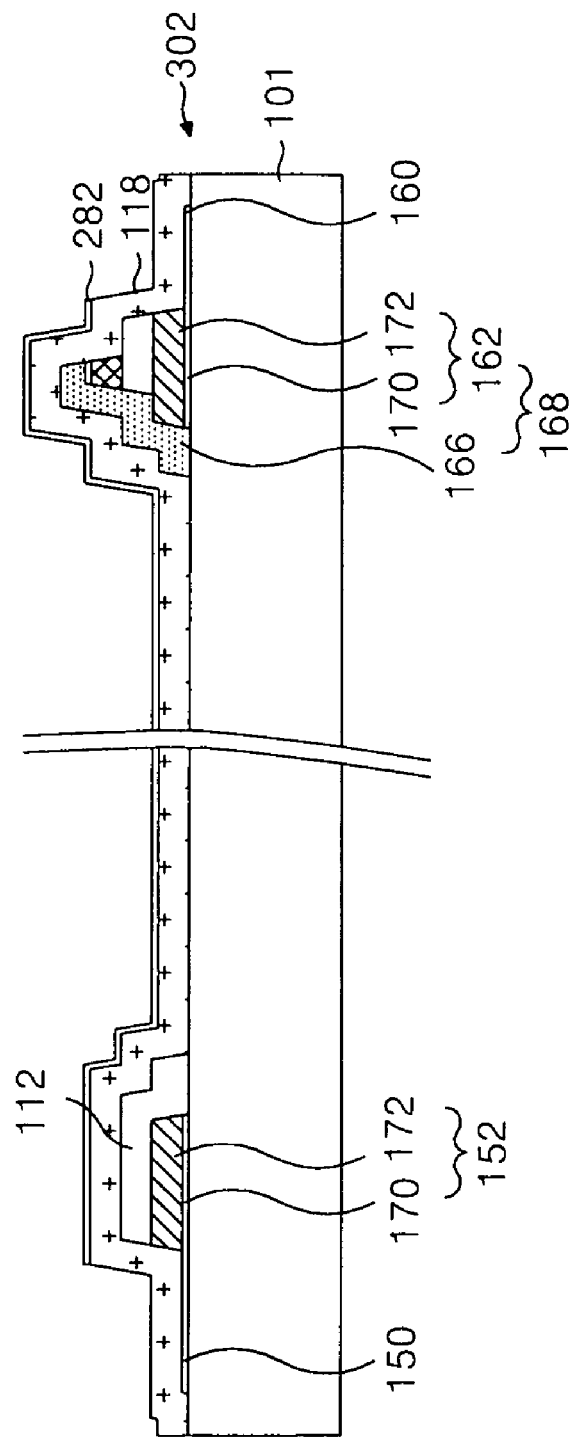
Figure 27C:
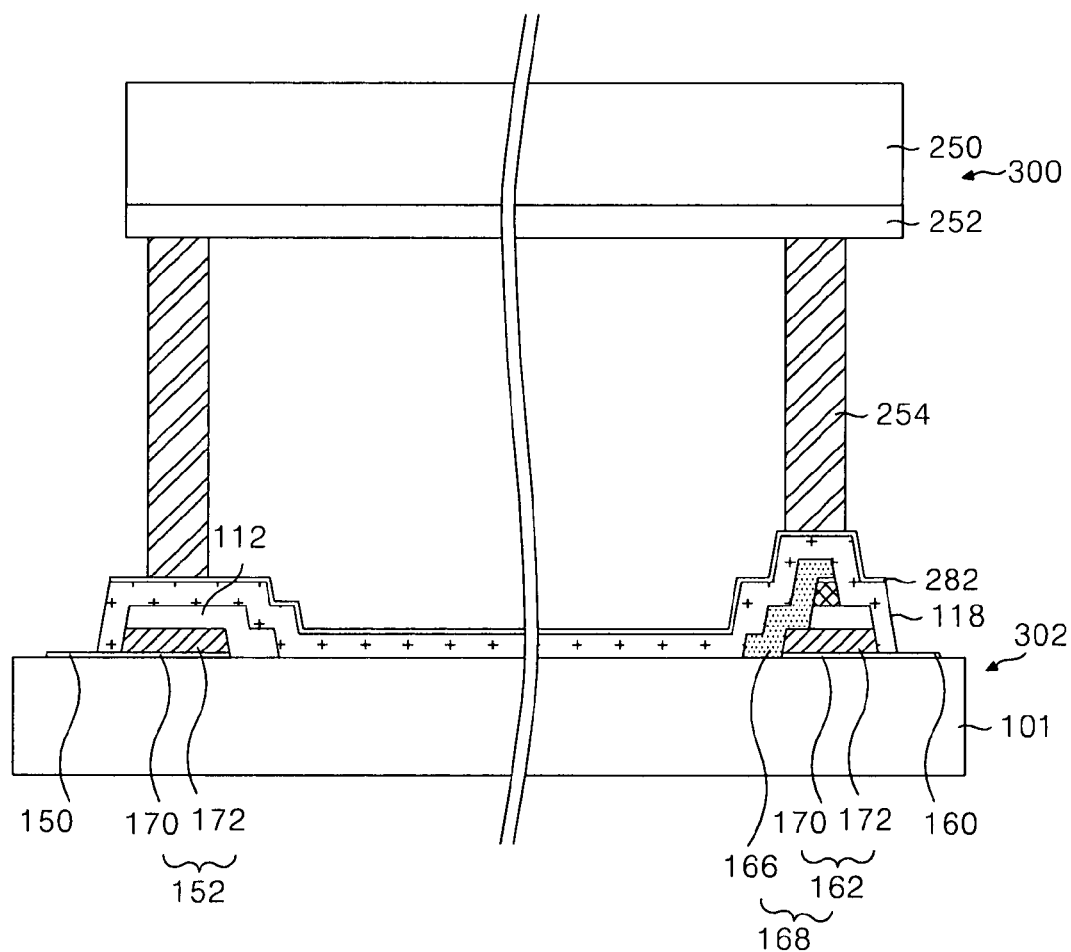

According to principles of the present invention, the TFT array substrate 302 may be formed according to any of the first to third embodiments discussed above. After being formed, the TFT array substrate 302 may be cleaned with a cleaning liquid and the alignment film 282 may be formed. In one aspect of the present invention, the alignment film 282 may be provided over portions of the TFT array substrate 302 outside the pad areas, as shown in FIG. 27A. In another aspect of the present invention, the alignment film 282 may include a material such as polyimide or the like. Thus, after forming the alignment film 282, portions of the passivation film 118 within the pad area may be patterned in any of the aforementioned etching processes using the alignment film 282 as a mask to expose portions of the transparent conductive material 170 within the various gate, data, and common pads 150, 160, 480, as shown in FIG. 27B. Next, the alignment film 282 may rubbed, exposed to light, etc., to form a predetermined alignment direction and complete formation of the alignment film 282. Subsequently, the color filter array substrate 300 and TFT array substrate 302 may be joined to each other via the sealant 254, as shown in FIG. 27C.

As described above, the principles of the present invention, a TFT array substrate may be formed in a three-mask process, wherein the pixel electrode and gate pattern may be formed in a first mask process, the semiconductor pattern may be formed in a second mask process, and the data pattern may be formed in a third mask process that includes exposing portions of a transparent conductive material included within the pixel electrode, a gate pad, a data pad, and an optional common pad. Accordingly, the principles of the present invention enable a TFT array substrate to be fabricated simply, reducing manufacturing cost and improving production yield. Further, the transparent conductive material is highly resistant to corrosion. Therefore, portions of the transparent conductive material comprised within the gate, data, and common pads 150, 160, and 480 are exposed by the gate metal material 172 to ensure high reliability against corrosion.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display panel, comprising:
    forming a gate pattern and a pixel electrode on a substrate, wherein the gate pattern includes a gate line, a gate electrode, a gate pad, and a data pad and wherein the gate pattern and pixel electrode include a transparent conductive material;
    forming a semiconductor pattern and a gate insulating pattern on the substrate, on the gate pattern, and on the pixel electrode;
    forming a data pattern on the substrate, the semiconductor pattern, and the gate insulating pattern, wherein the data pattern includes a data line, a source electrode, and a drain electrode overlapping the pixel electrode;
    exposing portions of the transparent conductive material within the data pad, the gate pad, and the pixel electrode within the data pattern;
    forming a passivation film over an entirety of the surface of the substrate;
    forming an alignment film on the passivation film in a predetermined pattern not overlapping the gate and data pads; and
    removing portions of the passivation film overlapping the gate and data pads using the alignment film as a mask, thereby exposing the portions of the transparent conductive material included within said gate and data pads,
    wherein the pixel electrode includes a gate metal material between the transparent conductive material formed and the overlapping drain electrode.

2. The method as claimed in claim 1, wherein removing portions of the passivation film includes selectively etching the passivation film with respect to the alignment film.

3. The method as claimed in claim 1, further including forming the semiconductor and gate insulating patterns along the gate pattern, wherein a width of the semiconductor and gate insulating patterns is larger than a width of the gate pattern.

4. The method as claimed in claim 1, forming the semiconductor and gate insulating patterns to expose the gate pad, the data pad, and the pixel electrode.

5. The method as claimed in claim 1, further comprising forming a redundancy line contacting a lower surface of the data line to compensate for a resistance of the data line, wherein a width of the redundancy line is less than a width of the data line.

6. The method as claimed in claim 1, further comprising:
    forming a common electrode parallel to the pixel electrode for generating a horizontally oriented electric field with respect to the pixel electrode;
    forming a common line parallel to the gate line and connected to the common electrode; and
    forming a common pad connected to the common line for supplying a reference voltage to the common line.

7. The method as claimed in claim 1, further comprising forming a storage capacitor, wherein the storage capacitor includes a storage electrode overlapping the gate line and wherein the storage electrode is insulated from the gate line and is connected to the pixel electrode.

8. The method as claimed in claim 2, further including etching the passivation film with a gas including at least one of $Cl_2$, $CF_4$, $SF_6$, $CHF_3$, $NF_3$, $O_2$, and HF.

9. A method of fabricating a liquid crystal display panel, comprising:
    forming a thin film transistor (TFT) array substrate; wherein forming the TFT array substrate includes:
    forming a plurality of gate lines provided on a substrate;
    forming a plurality of data lines crossing the gate lines to define a plurality of pixel areas;
    forming a gate insulating pattern between the gate and data lines;
    forming a TFT at each crossing of the gate and data lines;
    forming a passivation film over the TFTs;
    forming a pixel electrode within each pixel area, wherein a portion of each pixel electrode is overlapped by a portion of a TFT;
    forming a plurality of gate pads connected to the plurality of gate lines; and
    forming a plurality of data pads connected to the plurality of data lines,
    wherein the gate line, the gate pad, the data pad, and the pixel electrode include a transparent conductive material and wherein the pixel electrode includes a gate metal material between the transparent conductive material and the overlapping portion of the TFT;
    forming a color filter array substrate;
    joining the TFT array substrate with the color filter array substrate, wherein:
    a first portion of the TFT array substrate is overlapped by the joined color filter array substrate;
    a second portion of the TFT array substrate is not overlapped by the joined color filter array substrate; and
    the gate and data pads are in the second portion of the TFT array substrate; and
    exposing portions of the transparent conductive material within the gate and data pads using the color filter array substrate as a mask.

10. The method as claimed in claim 9, wherein forming the TFT array substrate further includes:
    forming a gate pattern on the substrate, wherein the gate pattern includes the gate lines, a plurality of gate electrodes, the gate pads, and the data pads;

forming a semiconductor pattern and the gate insulating pattern on the substrate, the gate pattern, and the pixel electrode;

forming a data pattern on the substrate, on the gate pattern, the pixel electrode, and the gate insulating and semiconductor patterns, wherein the data pattern includes the data lines, source electrodes, and drain electrodes;

exposing portions of the transparent conductive material within data pads, the gate pads, and the pixel electrode within the data pattern; and forming a passivation film over an entirety of the surface of the substrate and on the data pattern.

11. The method as claimed in claim 10, further comprising:

forming a common electrode parallel to the pixel electrode for generating a horizontally oriented electric field with respect to the pixel electrode;

forming a common line parallel to the gate line and connected to the common electrode; and forming a common pad connected to the common line for supplying a reference voltage to the common line.

12. The method as claimed in claim 9, wherein forming the color filter array substrate includes forming a common electrode on an upper substrate for generating a vertically oriented electric field with respect to the pixel electrode.

13. The method as claimed in claim 10, wherein forming the semiconductor and gate insulating patterns includes exposing the gate pads, the data pads, and the pixel electrodes within the semiconductor and gate insulating patterns.

14. The method as claimed in claim 9, wherein exposing portions of the transparent conductive material within the gate and data pads includes dry etching the passivation film in a plasma using the color filter array substrate as a mask.

15. The method as claimed in claim 9, wherein exposing portions of the transparent conductive material within the gate and data pads includes dry etching portions of the passivation film overlapping the gate and data pads using an etchant gas.

16. The method as claimed in claim 10, wherein forming the semiconductor and gate insulating patterns includes forming the semiconductor and gate insulating patterns along the gate pattern, wherein a width of the semiconductor and gate insulating patterns is larger than a width of the gate pattern.

17. The method as claimed in claim 14, wherein the exposing includes:

in a first exposure, exposing portions of the transparent conductive material within one of the gate and data pads; and in a second exposure, exposing portions of the transparent conductive material within the other of the gate and data pads.

18. The method as claimed in claim 14, wherein the exposing includes sequentially exposing portions of the transparent conductive material within individual ones of the plurality of gate pads and sequentially exposing portions of the transparent conductive material within individual ones of the plurality of data pads.

19. The method as claimed in claim 14, wherein the exposing includes:

providing a plurality of liquid crystal display panels within a chamber;

injecting gas into the chamber;

generating a plasma from the injected gas; and etching the passivation film of each liquid crystal display panel by using the generated plasma.

20. The method as claimed in claim 14, wherein exposing portions of the transparent conductive material within the gate and data pads includes:

arranging a plurality of liquid crystal display panels within a cassette;

loading the cassette having the plurality of liquid crystal display panels arranged therein into a chamber having a plurality of plasma generators;

generating plasma from the plurality of plasma generators; and etching the passivation film of each liquid crystal display panel using the generated plasma.

21. The method as claimed in claim 15, wherein the etchant gas includes at least one of $Cl_2$, $CF_4$, $SF_6$, $CHF_3$, $NF_3$, $O_2$, and HF.

* * * * *